(12) United States Patent
Horii et al.

(10) Patent No.: US 9,893,281 B2
(45) Date of Patent: Feb. 13, 2018

(54) SEMICONDUCTOR DEVICE AND METHOD OF FABRICATING THE SAME

(71) Applicant: Samsung Electronics Co., Ltd., Suwon-si (KR)

(72) Inventors: Hideki Horii, Seoul (KR); Jeonghee Park, Hwaseong-si (KR); Sugwoo Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/344,772

(22) Filed: Nov. 7, 2016

(65) Prior Publication Data

US 2017/0054075 A1 Feb. 23, 2017

Related U.S. Application Data

(62) Division of application No. 14/746,039, filed on Jun. 22, 2015, now Pat. No. 9,520,556.

(30) Foreign Application Priority Data

Aug. 21, 2014 (KR) ........................ 10-2014-0109081

(51) Int. Cl.
*H01L 47/00* (2006.01)
*H01L 45/00* (2006.01)
*H01L 27/24* (2006.01)

(52) U.S. Cl.
CPC ...... *H01L 45/1608* (2013.01); *H01L 27/2436* (2013.01); *H01L 27/2463* (2013.01);
(Continued)

(58) Field of Classification Search
CPC ............... H01L 45/1253; H01L 45/065; H01L 45/1233; H01L 27/2463; H01L 45/1608;
(Continued)

(56) References Cited

U.S. PATENT DOCUMENTS 7,679,133 B2 3/2010 Son et al.
8,198,124 B2 6/2012 Greeley et al.
(Continued)

FOREIGN PATENT DOCUMENTS

JP 2011054830 3/2011
JP 2011066135 3/2011
(Continued)

OTHER PUBLICATIONS

"Semiconductor Device and Method of Fabricating the Same" Specification, Drawings, and Prosecution History, of U.S. Appl. No. 14/746,039, filed Jun. 22, 2015, by Hideki, Horii, et al.

*Primary Examiner* — A. Sefer
(74) *Attorney, Agent, or Firm* — Onello & Mello, LLP

(57) ABSTRACT

Provided are a semiconductor device and a method of fabricating the same. The semiconductor device may include a selection element, a lower electrode pattern provided on the selection element to include a horizontal portion and a vertical portion; and a phase-changeable pattern on the lower electrode pattern. The vertical portion may extend from the horizontal portion toward the phase-changeable pattern and have a top surface, whose area is smaller than that of a bottom surface of the phase-changeable pattern.

8 Claims, 35 Drawing Sheets

(52) U.S. Cl.
CPC ............ *H01L 45/06* (2013.01); *H01L 45/065* (2013.01); *H01L 45/1233* (2013.01); *H01L 45/1253* (2013.01); *H01L 45/1273* (2013.01); *H01L 45/141* (2013.01)

(58) Field of Classification Search
CPC ... H01L 45/06; H01L 45/1273; H01L 45/141; H01L 27/2436
See application file for complete search history.

(56) References Cited

U.S. PATENT DOCUMENTS

| | | |
|---|---|---|
| 8,415,661 B2 | 4/2013 | Greeley et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,686,411 B2 | 4/2014 | Greeley et al. |
| 8,759,979 B2 | 6/2014 | Lee |
| 8,853,682 B2 | 10/2014 | Greeley et al. |
| 2009/0121271 A1 | 5/2009 | Son et al. |
| 2010/0117046 A1 | 5/2010 | Change et al. |
| 2011/0001114 A1 | 1/2011 | Zanderighi et al. |
| 2011/0053335 A1 | 3/2011 | Sasaki |
| 2011/0065252 A1 | 3/2011 | Nakamura |
| 2011/0165728 A1 | 7/2011 | Greeley et al. |
| 2011/0216603 A1 | 9/2011 | Han et al. |
| 2011/0233648 A1 | 9/2011 | Seol et al. |
| 2012/0051143 A1 | 3/2012 | Yoon et al. |
| 2012/0241911 A1 | 9/2012 | Greeley et al. |
| 2012/0305522 A1 | 12/2012 | Park et al. |
| 2013/0099190 A1 | 4/2013 | Oh et al. |
| 2013/0099386 A1 | 4/2013 | Lee |
| 2013/0102150 A1 | 4/2013 | Oh et al. |
| 2013/0134377 A1* | 5/2013 | Park ........................ H01L 45/06 257/4 |
| 2013/0234091 A1 | 9/2013 | Greeley et al. |
| 2013/0279262 A1 | 10/2013 | Yoon et al. |
| 2013/0288391 A1* | 10/2013 | Lee .......................... H01L 45/16 438/3 |
| 2014/0166972 A1 | 6/2014 | Greeley et al. |
| 2014/0248765 A1 | 9/2014 | Lee |
| 2014/0273395 A1 | 9/2014 | Kim et al. |
| 2014/0322888 A1 | 10/2014 | Hong et al. |

FOREIGN PATENT DOCUMENTS

| | | |
|---|---|---|
| KR | 100876767 | 1/2009 |
| KR | 100915823 | 9/2009 |
| KR | 2010052300 | 5/2010 |
| KR | 2011002436 | 1/2011 |
| KR | 2013044496 | 5/2013 |
| KR | 101375434 | 3/2014 |

\* cited by examiner

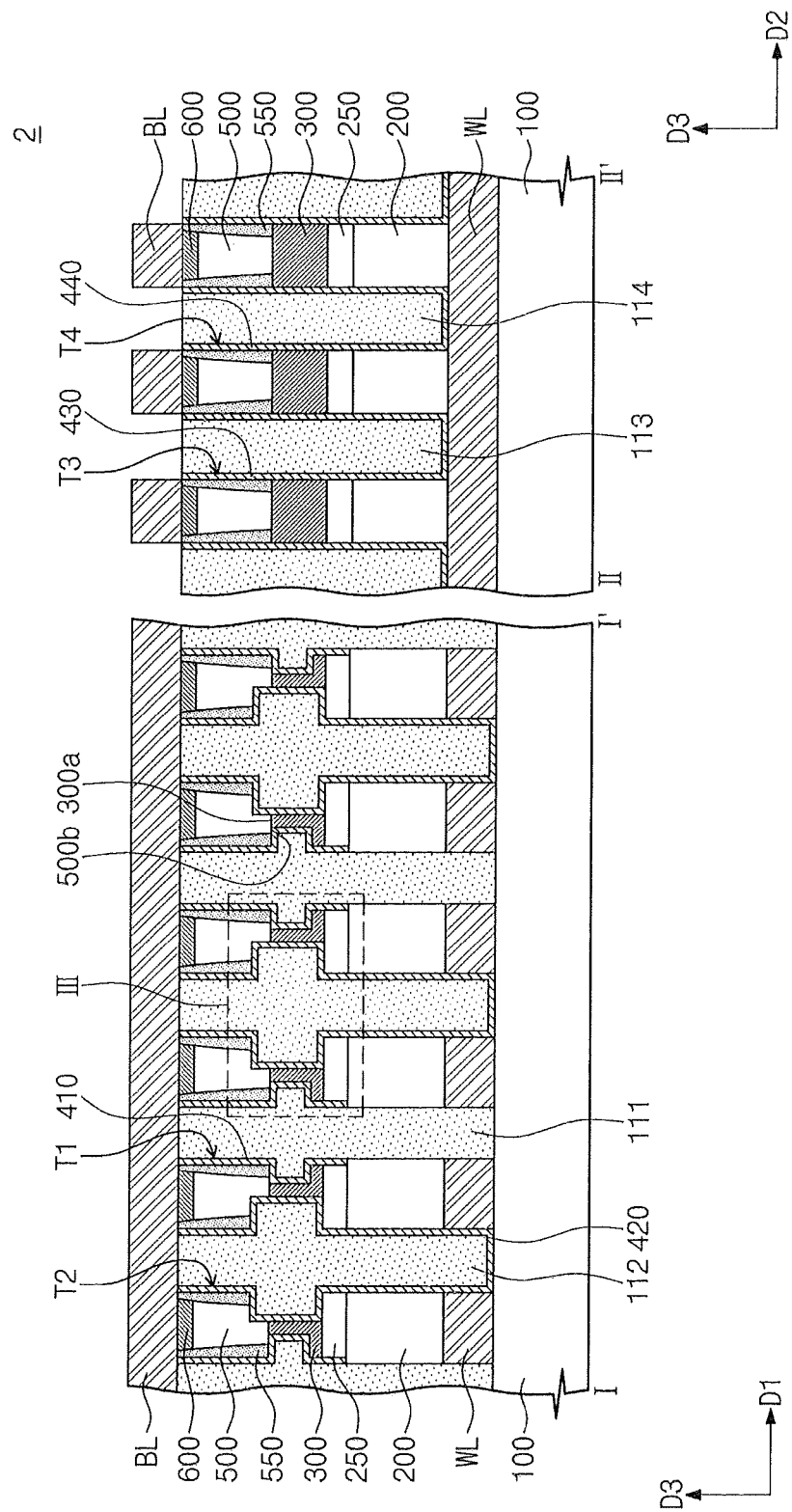

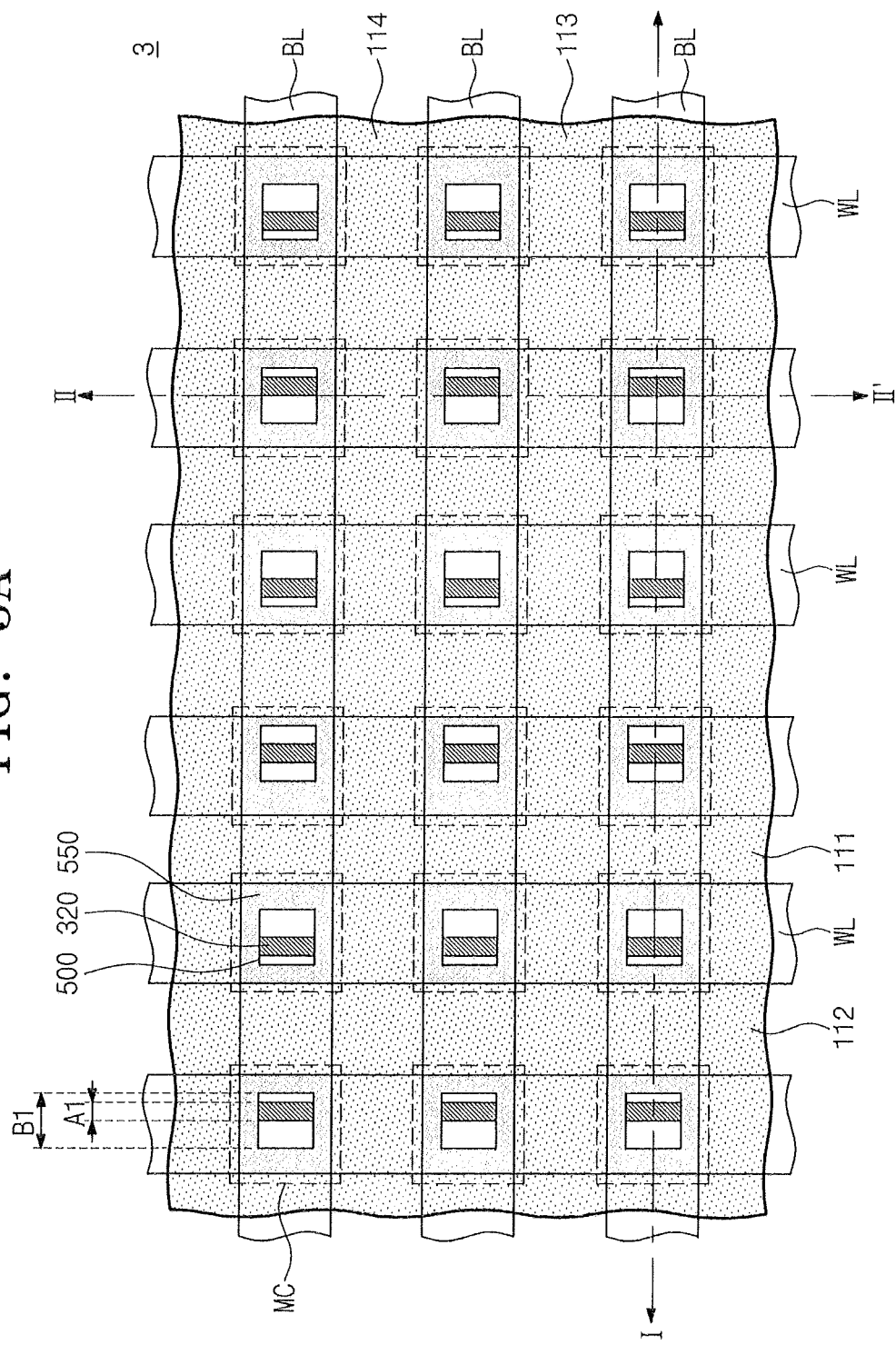

SEMICONDUCTOR DEVICE AND METHOD OF FABRICATING THE SAME

CROSS-REFERENCE TO RELATED APPLICATIONS

This application is a divisional application of U.S. patent application Ser. No. 14/746,039, filed on Jun. 22, 2015, which claims priority under 35 U.S.C. § 119 to Korean Patent Application No. 10-2014-0109081, filed on Aug. 21, 2014, in the Korean Intellectual Property Office, the entire contents of which are hereby incorporated by reference.

FIELD OF THE INVENTION

Example embodiments of the inventive concepts relate to a semiconductor device and a method of fabricating the same, and in particular, to a semiconductor device including a phase-changeable pattern and a method of fabricating the same.

BACKGROUND

Next-generation semiconductor memory devices (e.g., a ferroelectric random access memory (FRAM), a magnetic random access memory (MRAM), a phase-change random access memory (PRAM), and so forth) are being developed to meet increasing demands for high performance and low power consumption of semiconductor memory devices. In the next-generation semiconductor memory devices, a memory element may be formed of a non-volatile and variable resistance material. In other words, the memory element may exhibit an electric resistance that can be selectively changed depending on a current or voltage applied thereto and can be preserved even when a current or voltage is not supplied.

PRAMs are of particular interest because they have the potential for high operation speed and high integration density. Accordingly, intensive research is being performed in the area of PRAM device.

SUMMARY

Example embodiments of the inventive concepts provide a semiconductor device with an improved operation current property and a method of fabricating the same.

Other example embodiments of the inventive concepts provide a semiconductor device with higher reliability and a method of fabricating the same.

According to example embodiments of the inventive concepts, a semiconductor device may include a substrate, on which a plurality of memory cells are provided, and an insulating pattern provided on the substrate to define a feature of the memory cells. Each of the memory cells may include a selection element on the substrate, a lower electrode pattern provided on the selection element to have a horizontal portion and a vertical portion, a phase-changeable pattern on the lower electrode pattern, and a protection pattern interposed between the lower electrode pattern and the insulating pattern and extended to cover a side surface of the phase-changeable pattern. The vertical portion may be extended from the horizontal portion toward the phase-changeable pattern and may have a top surface having an area smaller than that of a bottom surface of the phase-changeable pattern.

In example embodiments, the horizontal portion may have a thickness that is substantially the same as a width of the vertical portion.

In example embodiments, the device may further include a spacer pattern provided on a side surface of the phase-changeable pattern.

In example embodiments, the vertical portion may have a width ranging from about 1 nm to about 10 nm.

In example embodiments, the insulating pattern may be provided in first and second trenches crossing each other on the substrate, and the memory cells may be separated from each other by the first and second trenches.

In example embodiments, the device may further include word lines extending parallel to a direction, on the substrate, and bit lines extending parallel to another direction substantially orthogonal to the direction, the bit lines crossing the word lines. The memory cells may be provided at respective intersections of the word lines and the bit lines.

In example embodiments, the memory cells disposed on two adjacent ones of the word lines may be provided to have bilateral symmetry with respect to a line therebetween.

In example embodiments, the vertical portions disposed on each of the word lines may be spaced apart from each other by a substantially same distance.

In example embodiments, when viewed in a plan view, the vertical portion may be provided to have a longitudinal axis parallel to the word lines.

According to example embodiments of the inventive concepts, a method of fabricating a semiconductor device may include forming a selection device layer, a first sacrificial pattern, and a second sacrificial pattern on a substrate, forming a first trench to penetrate the first and second sacrificial patterns, laterally etching a side surface of the first sacrificial pattern to form a recess region exposing a bottom surface of the second sacrificial pattern, the recess region being connected to the first trench, conformally forming a lower electrode pattern in the recess region to cover a top surface of the selection device layer, the side surface of the first sacrificial pattern, and the bottom surface of the second sacrificial pattern, forming a first protection pattern in the first trench and the recess region to cover the lower electrode pattern and the second sacrificial pattern, and forming an insulating pattern in the first trench to cover the first protection pattern.

In example embodiments, the method may further include forming a second trench to penetrate the first sacrificial pattern and the second sacrificial pattern, removing the first sacrificial pattern exposed by the second trench to expose the lower electrode pattern, forming a second protection pattern in the second trench to cover the lower electrode pattern, and forming a second insulating pattern in the second trench to cover the second protection pattern.

In example embodiments, the method may further include forming second mask layers spaced apart from each other on the second sacrificial pattern and a first mask layer interposed between the second mask layers. The forming of the first trench may include etching the second sacrificial pattern exposed by the first and second mask layers.

In example embodiments, the forming of the second trench may include removing the first mask layer to expose the second sacrificial pattern, and removing the second sacrificial pattern exposed by the second mask layer.

In example embodiments, the method may further include removing the second sacrificial pattern to form a contact hole exposing the first protection pattern, and forming a phase-changeable pattern in the contact hole.

In example embodiments, the forming of the contact hole may include removing the lower electrode pattern from a top surface of the first protection pattern to expose the first protection pattern.

In example embodiments, a portion of the phase-changeable pattern may be in contact with the lower electrode pattern, and other portion of the phase-changeable pattern may be contact with the first and second protection patterns.

In example embodiments, the method may further include forming a spacer pattern on a side surface of the contact hole.

In example embodiments, the forming of the lower electrode pattern may include depositing a lower electrode layer in the first trench and the recess region to have a thickness ranging from 1 nm to 10 nm, and etching the lower electrode layer to remove the lower electrode layer from a side surface of the second sacrificial pattern.

According to example embodiments of the inventive concepts, a semiconductor device may include a substrate, a selection device layer on the substrate, an ohmic pattern on the selection device layer, a phase-changeable pattern on the ohmic pattern, a lower electrode pattern provided between the ohmic pattern and the phase-changeable pattern, the lower electrode pattern including a horizontal portion covering a portion of a top surface of the ohmic pattern and a vertical portion extending from the horizontal portion and being in contact with the phase-changeable pattern, the vertical portion exposing a bottom surface of the phase-changeable pattern at both sides thereof, a first protection pattern extending from a side surface of the lower electrode pattern to a side surface and the bottom surface of the phase-changeable pattern, and a second protection pattern extending from other side surface of the lower electrode pattern to other side surface and the bottom surface of the phase-changeable pattern. The bottom surface of the phase-changeable pattern on the first protection pattern may be positioned at a level that is the same as or higher than that of a top surface of the vertical portion, and the bottom surface of the phase-changeable pattern on the second protection pattern may be positioned at a level that is higher than the bottom surface of the phase-changeable pattern on the first protection pattern.

In example embodiments, the vertical portion may have a width that may be substantially equal to a thickness of the horizontal portion.

According to example embodiments of the inventive concepts, a semiconductor device comprises a variable resistance device having a first surface, a second surface opposing the first surface and a third surface interposed therebetween. An electrode has a horizontal portion substantially parallel to the third surface, a vertical portion connected to the horizontal portion and substantially orthogonal to the horizontal portion, and the vertical portion is connected to the third surface. A first trench is proximal to the first surface of the variable resistance device and has a first recessed portion proximal to a first surface of the vertical portion of the electrode. A second trench is proximal to the second surface of the variable resistance device and has a second recessed portion proximal to the second surface of the vertical portion of the electrode. The second surface opposed the first surface.

In example embodiments, the variable resistance device includes a phase-changeable material.

In example embodiments, the first recessed portion has a first length substantially equal to a length of the vertical portion of the electrode, and the second recessed portion has a second length greater than the length of the vertical portion of the electrode.

In example embodiments, the first recessed portion and the second recessed portion are bilaterally symmetrical.

In example embodiments, the vertical portion of the electrode is connected to the third surface of the variable resistance device at a location offset from a midpoint of the third surface.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3G and FIG. 3O are enlarged views of regions III of FIG. 3F and FIG. 3N, respectively.

FIG. 4B is a sectional view taken along lines I-I' and II-II' of FIG. 4A.

FIG. 5A is a plan view illustrating a semiconductor device according to another example embodiment of the inventive concepts.

Figure 1:
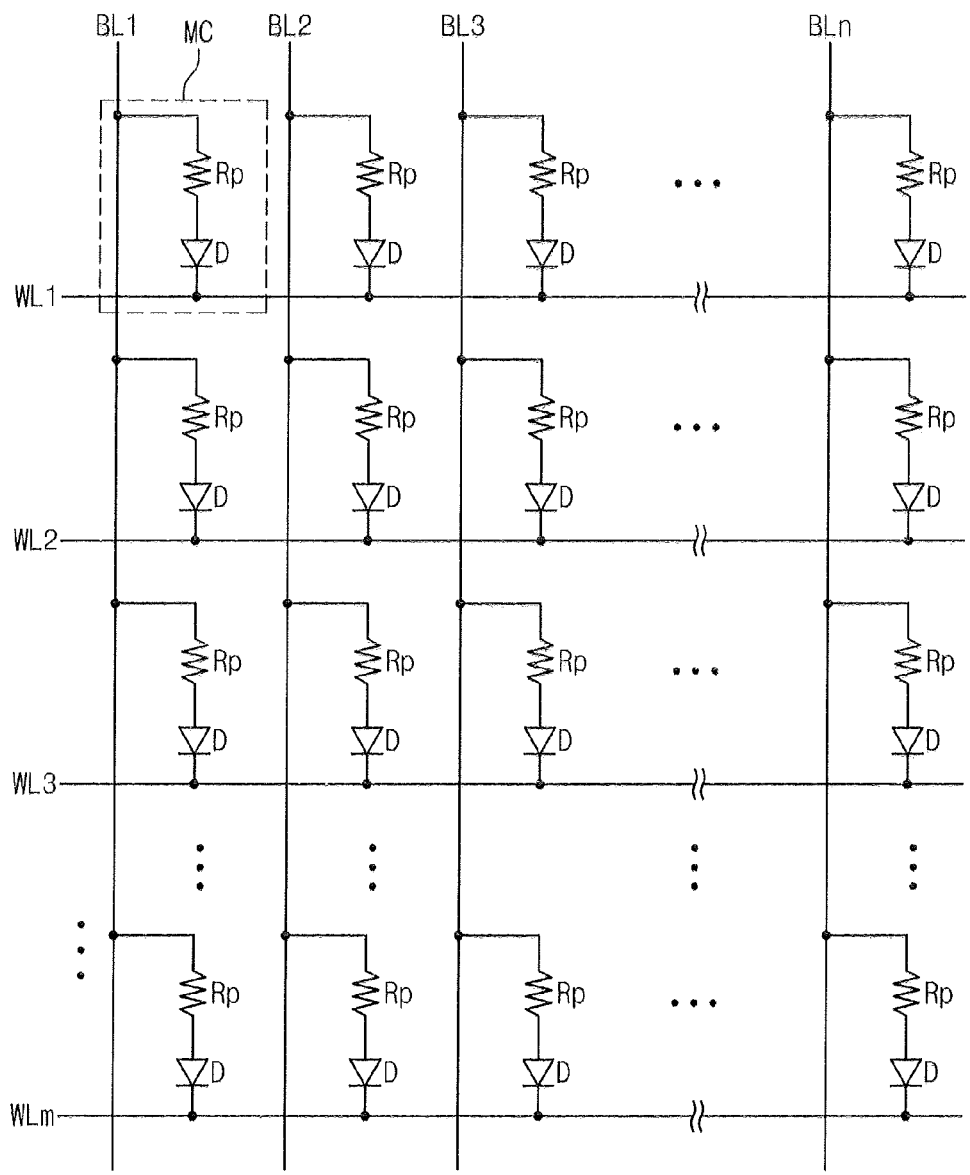
FIG. 1 is a schematic circuit diagram illustrating a memory cell array of a semiconductor device according to example embodiments of the inventive concepts.

It should be noted that these figures are intended to illustrate the general characteristics of methods, structure and/or materials utilized in certain example embodiments and to supplement the written description provided below. However, these drawings are not to scale, and may not precisely reflect the structural or performance characteristics of any given embodiment. These drawings should not be interpreted as defining or limiting the range of values or properties encompassed by example embodiments. For example, the relative thicknesses and positioning of molecules, layers, regions and/or structural elements may be reduced or exaggerated for clarity. The use of similar or

DETAILED DESCRIPTION

Example embodiments of the inventive concepts will now be described more fully with reference to the accompanying drawings, in which example embodiments are shown. However, example embodiments of the inventive concepts may be embodied in many different forms and should not be construed as being limited to the embodiments set forth herein Rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a phase changeable random access memory (PRAM) device will be described as an example of semiconductor devices according to example embodiments of the inventive concepts, but example embodiments of the inventive concepts may not be limited thereto. For example, the inventive concepts may be used to realize other variable resistance memory devices, such as a resistive memory device (RRAM), a magnetic RAM (MRAM), and a ferroelectric RAM (FRAM). Furthermore, the inventive concepts may be used to realize a dynamic RAM (DRAM), a static RAM (SRAM), a programmable ROM (PROM), an erasable PROM (EPROM), an electrically erasable PROM (EEPROM), a FLASH memory device.

In an embodiment of the present inventive concepts, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a schematic circuit diagram illustrating a memory cell array of a semiconductor device according to example embodiments of the inventive concepts.

Referring to FIG. 1, a memory cell array may include a plurality of word lines WL1-WLm, a plurality of bit lines BL1-BLn, and a plurality of memory cells MC. The memory cells MC may be located at respective intersections of the word lines WL1-WLm and the bit lines BL1-BLn.

In example embodiments, each of the memory cells MC may include a memory device Rp and a selection device D. The memory device Rp may be connected between a corresponding one the bit lines BL1-BLn and the selection device D, and the selection device D may be located between the memory device Rp and a corresponding one the word lines WL1-WLm.

The memory device Rp may be, or may include, a variable resistance device, whose resistance state can be switched by an electric pulse applied thereto. For example, the memory device Rp may include a phase-changeable material, whose crystal structure can be changed depending on an amount of current passing therethrough. For example, the phase-changeable material may be one of GeSbTe, GeTeAs, SnTeSn, GeTe, SbTe, SeTeSn, GeTeSe, SbSeBi, GeBiTe, GeTeTi, InSe, GaTeSe, and/or InSbTe, but example embodiments of the inventive concepts may not be limited thereto.

Depending on a heating temperature and/or a quenching speed, the phase-changeable material may have an amorphous structure having a relatively high resistance or a crystalline structure having a relatively low resistance. The crystal structure of the phase-changeable material may be switched to one of the two structures by adjusting Joule's heat. By adjusting an amount of current passing through the phase-changeable material, it is possible to control a Joule heating process and thereby to change a temperature of the phase-changeable material and the crystal structure of the phase-changeable material. The change in crystal structure, or phase, of the phase-changeable material can be used to selectively change data stored in the memory device Rp.

As another example, the memory device Rp may be configured to include one of perovskite compounds, transition metal oxides, magnetic materials, ferromagnetic materials, or antiferromagnetic materials, instead of the phase-changeable material.

In example embodiments, the selection device D may be used to control an amount of current flowing through the memory device Rp and the corresponding one of the word lines WL1-WLm, and such a switching operation of the selection device D may be controlled by a voltage applied to the corresponding one of the word lines WL1-WLm.

As an example, the selection device D may be a PN or PIN junction diode, whose anode and cathode are respectively connected to the memory device Rp and the corresponding one of the word lines WL1-WLm. In this case, if a difference in voltage between the anode and the cathode becomes greater than a threshold voltage of the diode or the diode is turned on, there may be an electric current passing through the memory device Rp.

As other example, the selection device D may be a metal-oxide-semiconductor (MOS) transistor. For example, the selection device D may be an NMOS transistor, whose gate electrode is connected to the corresponding one of the word lines WL1-WLm. In this case, the voltages of the word lines WL1-WLm may be controlled to selectively form a current flow passing through the memory device Rp. In another example, the selection device D may be a PMOS transistor, where the voltages of the word lines WL1-WLm would have a reversed polarity relative to the embodiments using an NMOS transistor for the selection device D. As still other example, the selection device D may be provided in the form of a PNP or NPN-type bipolar transistor.

Hereinafter, a semiconductor device according to example embodiments of the inventive concepts will be described.

Figure 2A:
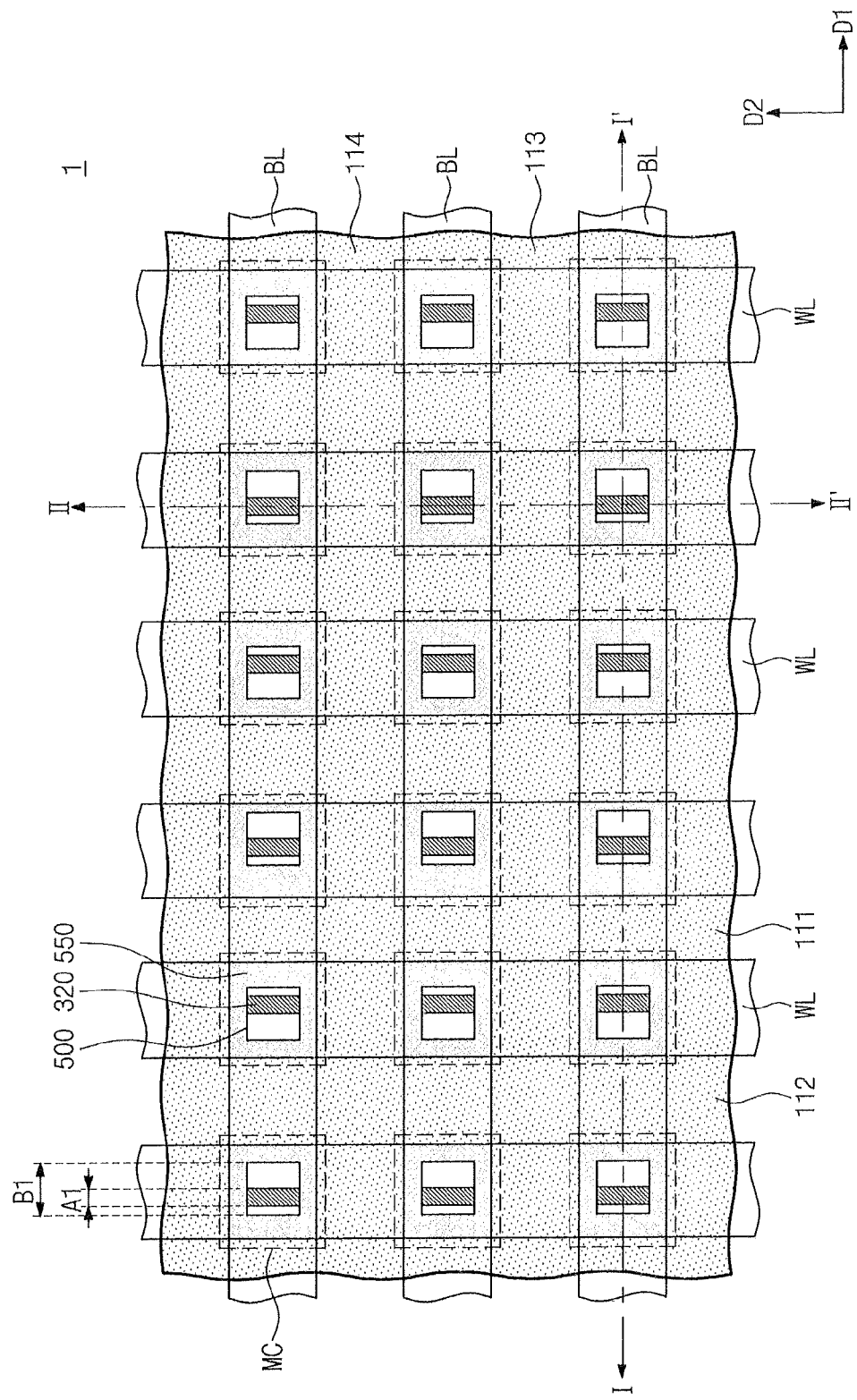
FIG. 2A is a plan view illustrating a semiconductor device according to example embodiments of the inventive concepts.
Figure 2B:
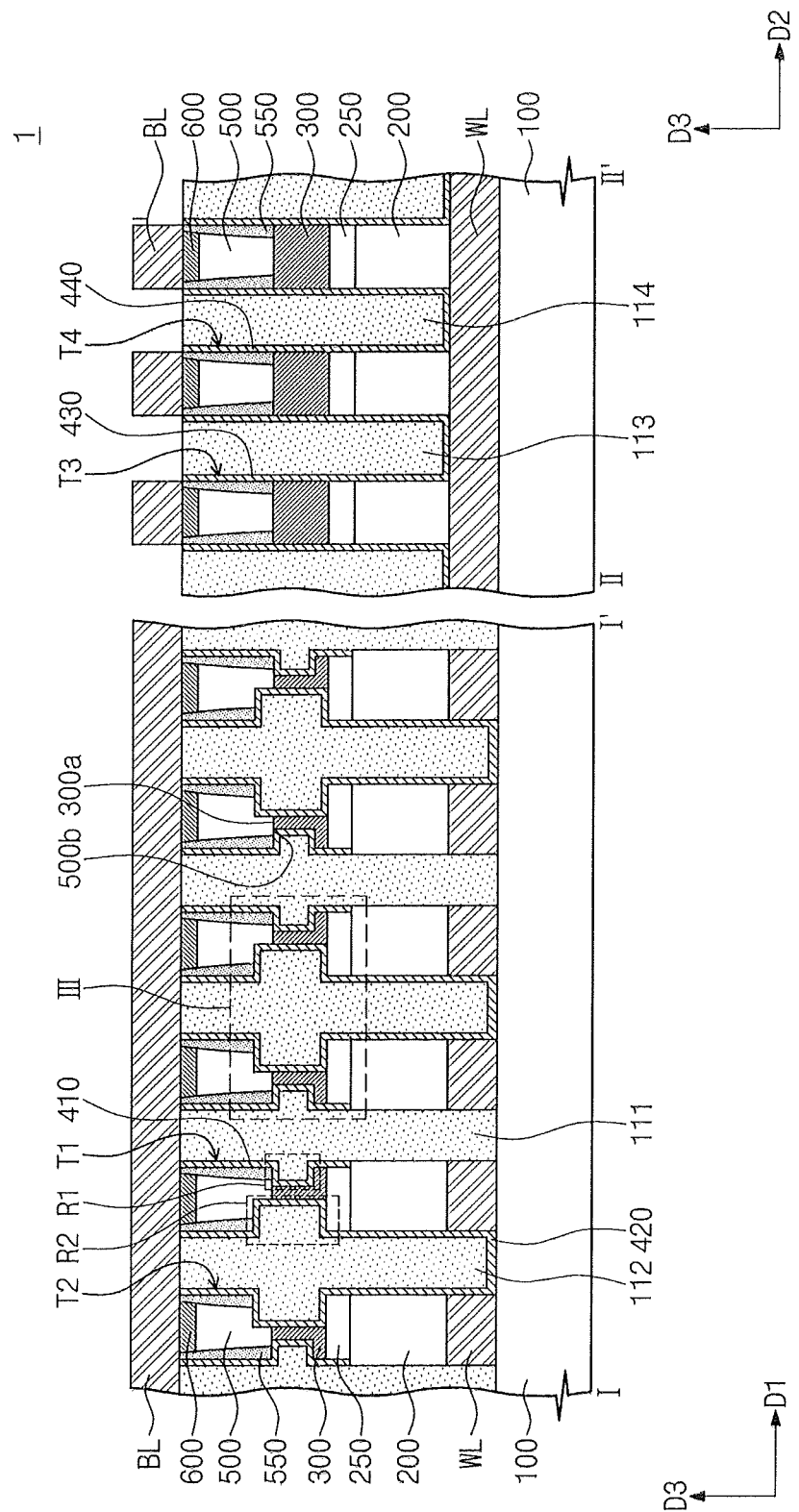
FIG. 2B is a sectional view taken along lines I-I' and II-II' of FIG. 2A.
Figure 2C:
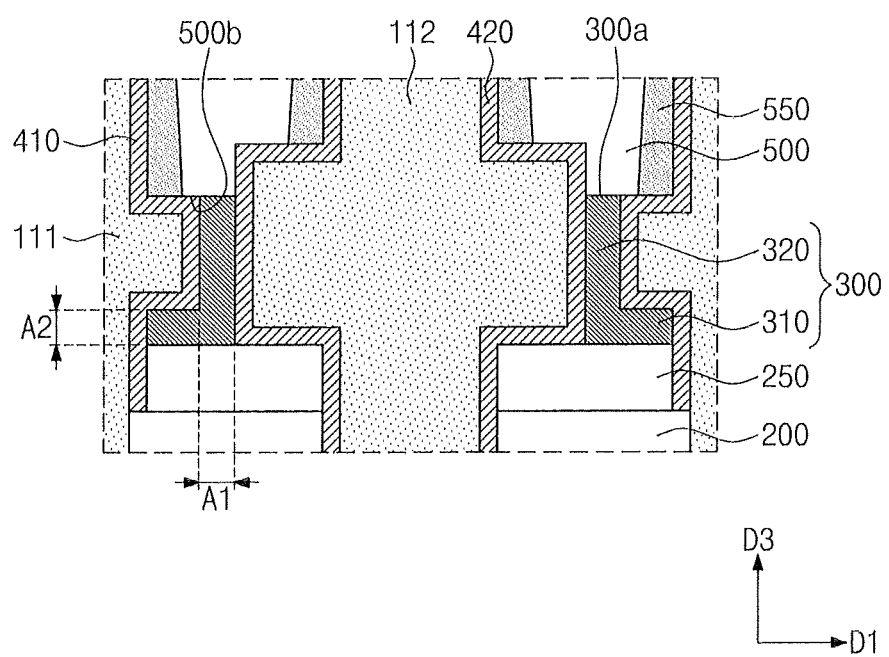
FIG. 2C is an enlarged view of a region III of FIG. 2B.

FIG. 2A is a plan view illustrating a semiconductor device according to example embodiments of the inventive concepts. FIG. 2B is a sectional view taken along lines I-I' and II-II' of FIG. 2A. FIG. 2C is an enlarged view of a region III of FIG. 2B. For the sake of brevity, the elements and features of this example that are similar to those previously shown and described will not be described in much further detail.

Referring to FIG. 2A and FIG. 2B, a semiconductor device 1 may include a substrate 100 and word lines WL, bit lines BL, and memory cells MC provided on the substrate 100. The substrate 100 may include a single crystalline semiconductor material. For example, the substrate 100 may be a silicon-on-insulator (SOI) substrate, a germanium substrate, a germanium-on-insulator (GOI) substrate, and/or a silicon-germanium substrate, but the substrate 100 may not be limited thereto.

The word lines WL may extend parallel to a second direction D2, on the substrate 100. The second direction D2 may be parallel to a top surface of the substrate 100. The word lines WL may be configured to have the same features as those of the word lines WL1-WLm described with reference to FIG. 1.

The memory cells MC may be located at respective intersections of the word lines WL and the bit lines BL. When viewed in a plan view, the memory cells MC may be overlapped with the word lines WL. For example, all the memory cells MC located on each of the word lines WL may have substantially the same width as the corresponding one of the word lines WL.

The memory cells MC may be defined or delimited by insulating patterns 111, 112, 113, and 114. The insulating patterns 111, 112, 113, and 114 may be interposed on the substrate 100 and between the word lines WL to enclose the memory cells MC. The insulating patterns 111, 112, 113, and 114 may be formed of, or include at least one of, Tonen SilaZene (TOSZ), tetraethyl orthosilicate (TEOS), and/or Undoped Silcate Glass (USG). The insulating patterns 111, 112, 113, and 114 may be extended into recess regions R1 and R2. The insulating patterns 111, 112, 113, and 114 may be provided in trenches T1, T2, T3, and T4. The first and second trenches, T1 and T2, may extend parallel to the second direction D2, and the third and fourth trenches, T3 and T4, may extend parallel to a first direction D1. Here, the second direction D2 may be parallel to the top surface of the substrate 100 and cross the first direction D1. In one embodiment, the direction D2 crosses the direction D1 at a substantially orthogonal angle.

Each of the memory cells MC may include a selection element 200, an ohmic pattern 250, a lower electrode pattern 300, a phase-changeable pattern 500, a spacer pattern 550, protection patterns 410, 420, 430, and 440, and an upper electrode pattern 600. The selection elements 200 may be provided on the word lines WL to serve as the selection device D of FIG. 1. The selection element 200 may be formed of, or include, a poly silicon layer. For example, the selection element 200 may include first and second semiconductor patterns (not shown), which are doped to have different conductivity types from each other. The selection element 200 may have a thickness ranging from about 60 nm to about 100 nm.

The ohmic pattern 250 may be interposed between the selection element 200 and the lower electrode pattern 300. The ohmic pattern 250 may include a metal silicide layer (e.g., titanium silicide, cobalt silicide, tantalum silicide, nickel silicide, or tungsten silicide). The ohmic pattern 250 may contribute to reduce electric resistance between the selection element 200 and the lower electrode pattern 300. In certain embodiments, the ohmic pattern 250 may be omitted.

The lower electrode pattern 300 may be provided on the ohmic pattern 250 to be in contact with the phase-changeable pattern 500. As shown in FIG. 2C, the lower electrode pattern 300 may have an "L"-shaped section. The lower electrode pattern 300 may include a horizontal portion 310 and a vertical portion 320 vertically extending from the horizontal portion 310. The horizontal portion 310 may cover a top surface of the ohmic pattern 250. The horizontal portion 310 may have a thickness ranging from about 1 nm to about 10 nm. The vertical portion 320 may extend from the horizontal portion 310 toward the phase-changeable pattern 500, for example, in a third direction D3 and may be in contact with a bottom surface 500b of the phase-changeable pattern 500. Here, the third direction D3 may be normal to the top surface of the substrate 100. The vertical portion 320 may have a thickness ranging from about 1 nm to about 10 nm. A width A1 of the vertical portion 320 may be substantially equal to a thickness A2 of the horizontal portion 310. In the present specification, the expression "substantially equal . . . in thickness or width" means that a variation in thickness between two elements under consideration is smaller than a variation in deposition thickness of a layer, which is formed by a single deposition process and may be used for one or both of the two elements. The vertical portion 320 may have an occupying area smaller than that of the horizontal portion 310. The lower electrode pattern 300 may be formed of, or include, a conductive material. As an example, the lower electrode pattern 300 may include at least one of high-melting point metals, such as TiN, TaN, TiON, WSi, WN, and/or TiW. As another example, the lower electrode pattern 300 may include at least one of metal nitrides, such as TiAlN, TiSiN, TaSiN, and/or TaAlN.

The protection patterns 410, 420, 430, and 440 may be provided on the substrate 100 to cover side surface of the lower electrode patterns 300. The protection patterns 410, 420, 430, and 440 may be interposed between the lower electrode patterns 300 and the insulating patterns 111, 112, 113, and 114. The lower electrode pattern 300 may be spaced apart from the insulating patterns 111, 112, 113, and 114. The protection patterns 410, 420, 430, and 440 may prevent the lower electrode pattern 300 from being oxidized in the fabrication process of the semiconductor device 1. The protection patterns 410, 420, 430, and 440 may include a material (e.g., silicon nitride and/or silicon oxynitride) having an etch selectivity with respect to the lower electrode patterns 300. The protection patterns 410, 420, 430, and 440 may be extended to cover side surfaces of the phase-changeable patterns 500.

The phase-changeable patterns 500 may be provided on the lower electrode patterns 300, respectively. The bottom surface 500b of the phase-changeable pattern 500 may be formed to have a staircase profile. The phase-changeable pattern 500 may serve as the memory device Rp of FIG. 1. The phase-changeable pattern 500 may include at least one of the phase-changeable materials enumerated in the previous description of FIG. 1. As another example, the phase-changeable pattern 500 may include at least one of perovskite compounds or transition metal oxide materials. In addition, the phase-changeable pattern 500 may further contain dopants, such as C, N, Si, O, N, and/or B.

In the first direction D1, a width B1 of the phase-changeable pattern 500 may be greater than the width A1 of the vertical portion 320 of the lower electrode pattern 300. A top surface 300a of the vertical portion 320 of the lower electrode pattern 300 may have an area smaller than that of the bottom surface 500b of the phase-changeable pattern 500. For example, the area of the top surface 300a of the vertical portion 320 may be about 54 nm², and the area of the bottom surface 500b of the phase-changeable pattern 500 may be about 143 nm². The areas may be mean values of areas of the memory cells MC. For example, the width A1 of the vertical portion 320 may be about 4 nm, and a length thereof may be about 13.5 nm. The bottom surface 500b of the phase-changeable pattern 500 may have a diameter of about 6.75 nm. A portion of the bottom surface 500b of the phase-changeable pattern 500 may be in contact with the lower electrode pattern 300, and another portion of the bottom surface 500b may be in contact with the first and second protection patterns 410 and 420. If a contact area between the phase-changeable pattern 500 and the lower electrode pattern 300 increases, a higher current may be needed to perform a program operation of the semiconductor device 1. In example embodiments, a contact area between the phase-changeable pattern 500 and the lower electrode pattern 300 can be reduced, compared with the case that the top surface 300a of the lower electrode pattern 300 has substantially the same area as the bottom surface 500b of the phase-changeable pattern 500. Thus, it is possible to reduce an amount of current required for a program operation of the semiconductor device 1 and thereby improve operational characteristics of the semiconductor device 1.

As shown in FIG. 2B, the spacer patterns 550 may be disposed between the phase-changeable patterns 500 and the insulating patterns 111, 112, 113, and 114. The spacer patterns 550 may cover the side surfaces of the phase-changeable patterns 500. When viewed in a plan view, each of the spacer patterns 550 may be provided to enclose a corresponding one of the phase-changeable patterns 500. The spacer patterns 550 may include an insulating material, (e.g., silicon oxide, silicon nitride, and/or silicon oxynitride). As another example, the spacer patterns 550 may include a high-k dielectric material (e.g., titanium oxide, zirconium oxide, magnesium oxide, and/or hafnium oxide). The spacer pattern 550 makes it possible to further reduce the contact area between the lower electrode pattern 300 and the upper electrode pattern 600. Accordingly, it is possible to further reduce an amount of current required for the program operation of the semiconductor device 1.

The upper electrode pattern 600 may be disposed on the phase-changeable pattern 500. The spacer pattern 550 may extend in between the upper electrode pattern 600 and the protection patterns 410, 420, 430, and 440. The upper electrode pattern 600 may include at least one of conductive materials or metal nitride materials (e.g., titanium nitride).

The bit lines BL may be provided on the substrate 100 to extend parallel to the first direction D1 or cross the word lines WL. In one embodiment, the bit lines BL cross the word lines WL at a substantially orthogonal angle. The bit lines BL may be configured to have substantially the same features as those of the bit lines BL1-BLn described with reference to FIG. 1. The bit lines BL may include at least one of conductive metallic materials (e.g., copper). The bit lines BL may be provided on the insulating patterns 111, 112, 113, and 114, and each of them may be connected in common to or be in contact with the memory cells MC arranged in a row. In the case where the phase-changeable pattern 500 is in direct contact with the bit line BL, a material contained in the phase-changeable pattern 500 may be reacted with a material contained in the bit line BL. However, according to example embodiments of the inventive concepts, such an unintended reaction between the phase-changeable pattern 500 and the bit lines BL can be prevented by the upper electrode pattern 600.

Hereinafter, the memory cells MC will be described in more detail. As shown in FIG. 2A, the memory cells MC may be two-dimensionally arranged along both the first and second directions D1 and D2. When viewed in a plan view, the vertical portions 320 of the memory cells MC may be disposed to form an arrangement as shown in FIG. 2A. As an example, the vertical portions 320 of the memory cells MC may be arranged to form a plurality of columns, each of which is parallel to the second direction D2 or the word lines WL. In each column, the vertical portions 320 of the memory cells MC may be spaced apart from each other in the second direction D2 by substantially the same distance. When viewed in a plan view, each of the vertical portions 320 may be formed in such a way that a longitudinal axis thereof is parallel to the second direction D2. In each pair of adjacent columns, the memory cells MC may be formed in such a way that the vertical portions 320 thereof are bilaterally symmetric with respect to a line that is both equidistant therefrom and parallel to the pair of adjacent columns. Further, as shown in FIG. 2B, in each pair of adjacent columns, the memory cells MC may be forming in such a way that vertical sections thereof are bilaterally symmetric with respect to the line equidistant therefrom. For example, in each pair of adjacent columns, the lower electrode patterns 300 may also be formed to have the bilateral symmetry with respect to the equidistant line thereof.

Referring to FIG. 2A and FIG. 2B, the memory cells MC may have substantially the same occupying area and shape. When viewed in a plan view, each of the memory cells MC may have a square shape. Further, the memory cells MC may be disposed to have the same pitch. In certain embodiments, a width of each of the memory cells MC may be substantially equal to a distance between adjacent ones of the memory cells MC.

The vertical portions 320 of the memory cells MC may have substantially the same size or area. For example, the widths A1 of the vertical portions 320 may be substantially the same in the first direction D1. Further, the top surfaces 300a of the vertical portions 320 may have substantially the same occupying area. The memory cells MC may be provided in such a way that there is substantially no difference in contact area between the lower electrode pattern 300 and the phase-changeable pattern 500. This allows substantially the same amount of current to flow through each of the memory cells MC in the program operation of the semiconductor device 1. Accordingly, the semiconductor device 1 can be operated with improved reliability, because the current density of the memory cell with the largest contact area will not be too low to cause ineffective programming, and the current density of the memory cell with the smallest contact area will not be too high, which may result in damage.

A method of fabricating a semiconductor device according to example embodiments of the inventive concepts will be described below.

Figure 3A:
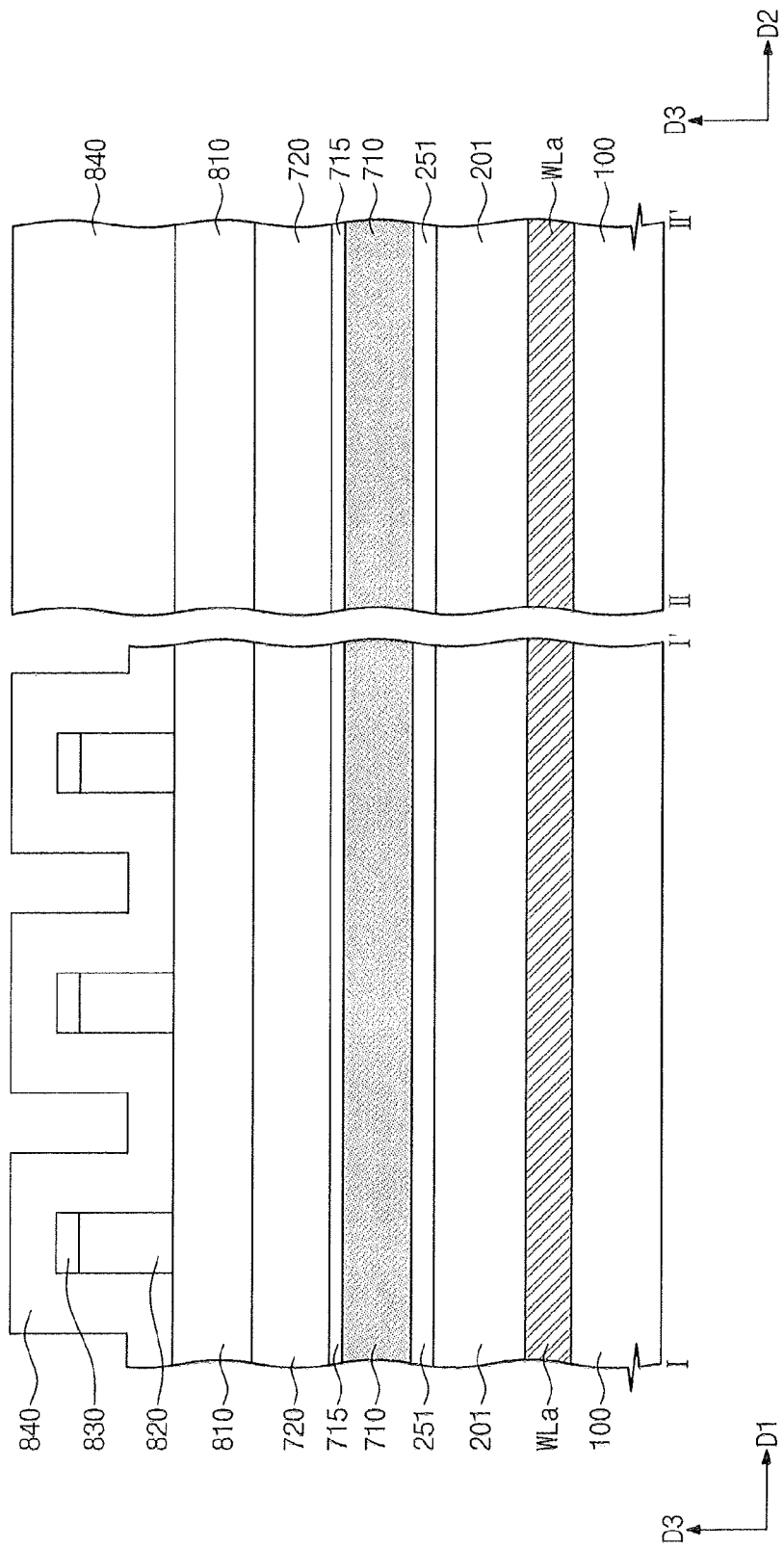
FIG. 3A through FIG. 3F, FIG. 3H through FIG. 3N, FIG. 3P, and FIG. 3Q are sectional views illustrating a method of fabricating a semiconductor device, according to example embodiments of the inventive concepts.

FIG. 3A through FIG. 3F, FIG. 3H through FIG. 3N, FIG. 3P, and FIG. 3Q are sectional views illustrating a method of fabricating a semiconductor device, according to example embodiments of the inventive concepts. FIG. 3G and FIG. 3O are enlarged views of regions III of FIG. 3F and FIG. 3N, respectively. For the sake of brevity, the elements and features of this example that are similar to those previously shown and described will not be described in much further detail.

Referring to FIG. 3A, a word line layer WLa, a selection device layer 201, an ohmic layer 251, a first sacrificial pattern 710, an etch stop layer 715, a second sacrificial pattern 720, and mask layers 810, 820, 830, and 840 may be sequentially formed on the substrate 100. The substrate 100 may be formed to have substantially the same features as that of FIG. 2A through FIG. 2C. The word line layer WLa may be formed of, or include, at least one conductive material (e.g., titanium nitride).

The selection device layer 201 may be formed on the word line layer WLa and may include a diode, which was described as an example of the selection device D of FIG. 1. The selection device layer 201 may be formed of, or include, a polysilicon layer. For example, the selection device layer 201 may include first and second semiconductor layers (not shown), which are doped to have different conductivity types from each other. The selection device layer 201 may have a thickness ranging from about 60 nm to 100 nm. The ohmic layer 251 may be formed on the selection device layer 201. The ohmic layer 251 may be formed of, or include, at least one metal silicide (e.g., tungsten silicide) and/or metal nitride (e.g., titanium nitride).

The first sacrificial pattern 710 may be formed on the ohmic layer 251. The first sacrificial pattern 710 may be formed of, or include, a material that is different from those of the ohmic layer 251, the etch stop layer 715, the second sacrificial pattern 720, and the first and second mask layers 830 and 840. For example, the first sacrificial pattern 710 may include a material having an etch selectivity with respect to the ohmic layer 251, the etch stop layer 715, the second sacrificial pattern 720, and the mask layers 810, 820, 830, and 840. As an example, the first sacrificial pattern 710 may be formed of, or include, a silicon oxide layer. The first sacrificial pattern 710 may have a thickness ranging from about 20 nm to 50 nm.

The etch stop layer 715 may be formed on the first sacrificial pattern 710. The etch stop layer 715 may be formed of, or include, a material (e.g., silicon nitride and/or silicon oxynitride) having an etch selectivity with respect to the first sacrificial pattern 710. In certain embodiments, the formation of the etch stop layer 715 may be omitted. The second sacrificial pattern 720 may be formed on the etch stop layer 715. As an example, the second sacrificial pattern 720 may be a polysilicon layer, which is formed by a deposition process and has a thickness ranging from about 70 nm to 100 nm.

A lower mask layer 810, a buffer mask layer 820, a first mask layer 830, and a second mask layer 840 may be sequentially formed on the substrate 100. The lower mask layer 810 may include silicon nitride and may have a thickness of about 50 nm. The buffer mask layer 820 may include an amorphous carbon layer (ACL). The first mask layer 830 may be formed on a top surface of the buffer mask layer 820 and may include a material having an etch selectivity with respect to the buffer mask layer 820. For example, the first mask layer 830 may include a metal oxide layer (e.g., aluminum oxide). The second mask layer 840 may be formed on a top surface of the lower mask layer 810 to cover a side surface of the buffer mask layer 820 and the first mask layer 830. The second mask layer 840 may be conformally formed by, for example, an atomic layer deposition (ALD) process and may include a silicon oxide layer.

Figure 3B:
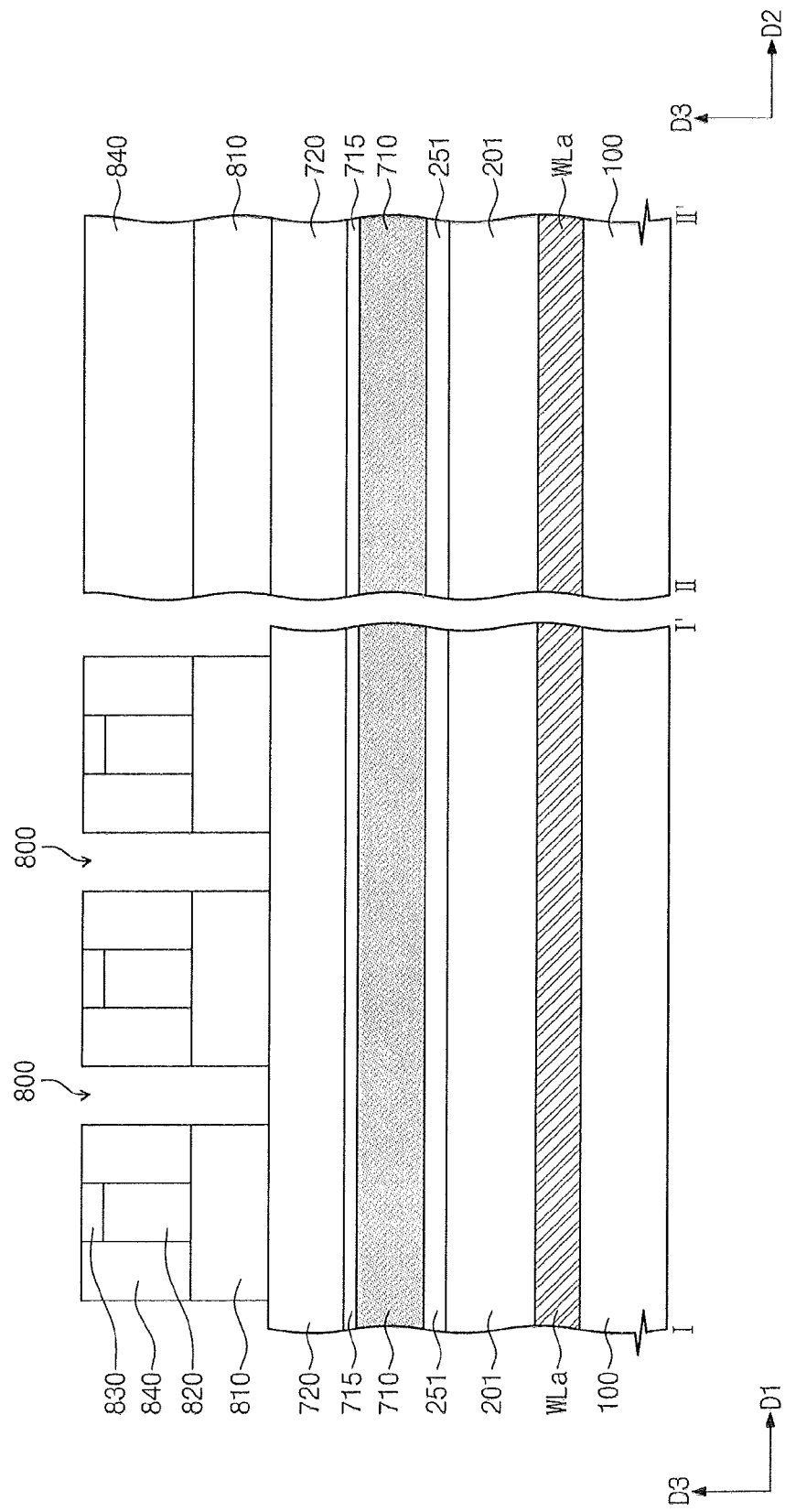

Referring to FIG. 3B, an opening 800 may be formed in the second mask layer 840 to expose the second sacrificial pattern 720. For example, the opening 800 may be formed by pattering the second mask layer 840 using an etching process. In certain embodiments, the etching of the second mask layer 840 may be performed to expose a top surface of the first mask layer 830. After the etching of the second mask layer 840, the lower mask layer 810 exposed by the opening 800 may be further etched, and thus, the opening 800 may be expanded into the lower mask layer 810 to expose the second sacrificial pattern 720.

Figure 3C:
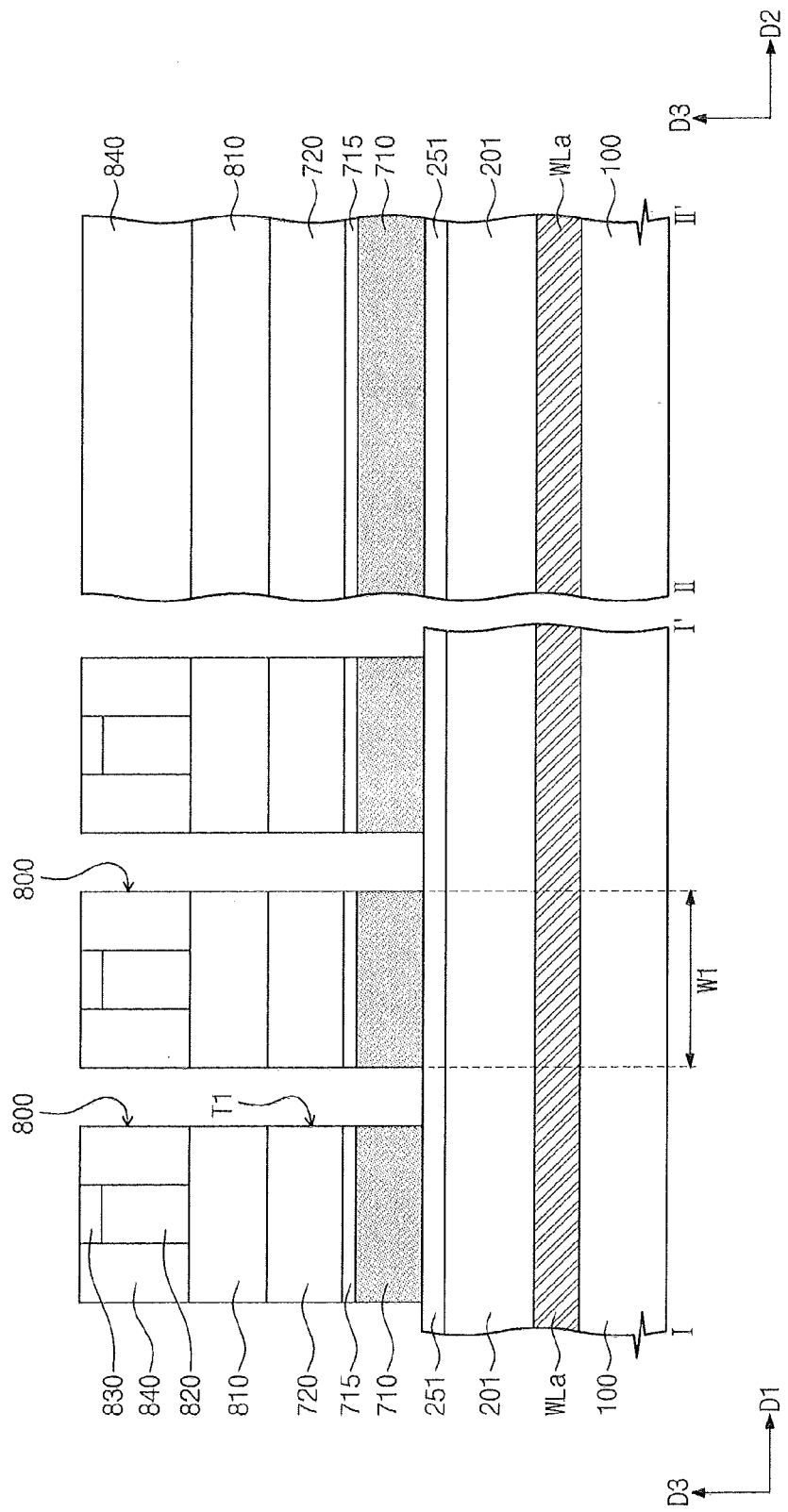

Referring to FIG. 3C, a first trench T1 may be formed to penetrate the second sacrificial pattern 720, the etch stop layer 715, and the first sacrificial pattern 710. For example, the second sacrificial pattern 720, the etch stop layer 715, and the first sacrificial pattern 710 may be etched using the first and second mask layers 830 and 840 as an etch mask. As an example, the second sacrificial pattern 720 exposed by the opening 800 may be etched to expose portions of the etch stop layer 715. The exposed portions of the etch stop layer 715 may be etched using the first and second mask layers 830 and 840 as an etch mask, and thus, the first trench T1 may be expanded into the etch stop layer 715. The first sacrificial pattern 710 exposed by the etch stop layer 715 may be etched, and thus, the first trench T1 may be expanded into the first sacrificial pattern 710 to expose a top surface of the ohmic layer 251. In example embodiments, the first trench T1 may be formed in such a way that the first sacrificial pattern 710 has a width W1 ranging from about 60 nm to 80 nm in the first direction D1. The widths of the etch stop layer 715 and the second sacrificial pattern 720 may be substantially the same as the width W1 of the first sacrificial pattern 710.

Figure 3D:
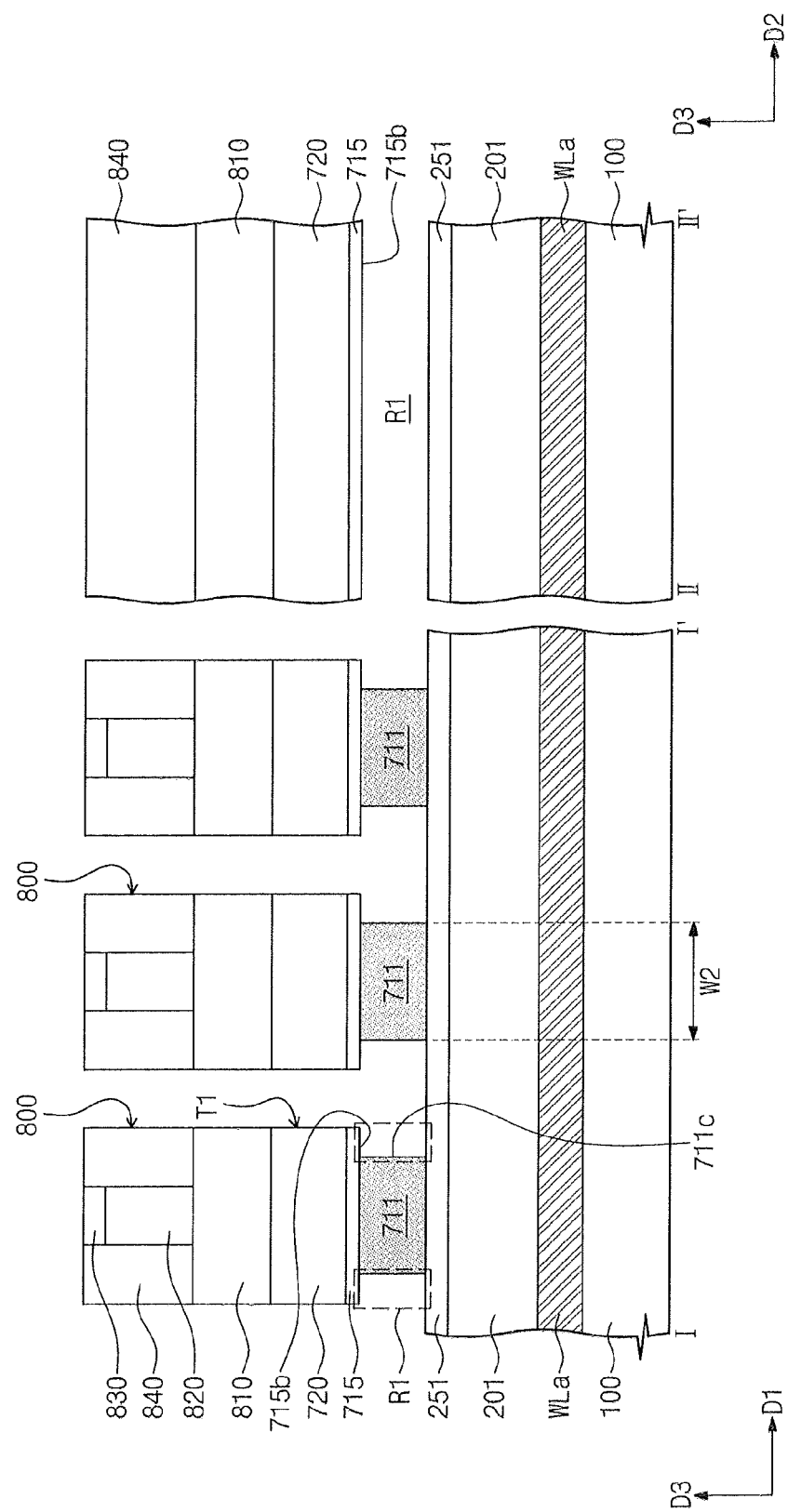

Referring to FIG. 3D in conjunction with FIG. 3C, a recess sacrificial pattern 711 may be formed by laterally etching side surfaces of the first sacrificial pattern 710. The etching process may be performed to selectively etch the first sacrificial pattern 710. As an example, in the case where the first sacrificial pattern 710 is formed of silicon oxide, the etching of the first sacrificial pattern 710 may be performed using a fluorine-containing gas. A width W2 of the recess sacrificial pattern 711 may be smaller than the width W1 of the first sacrificial pattern 710 of FIG. 3C. The width W2 of the recess sacrificial pattern 711 can be controlled by changing process conditions in the etching of the first sacrificial pattern 710. The etching of the first sacrificial pattern 710 may be performed to substantially prevent the second sacrificial pattern 720 and the etch stop layer 715 from being etched, and thus, the recess sacrificial pattern 711 may be formed to expose a bottom surface 715b of the etch stop layer 715. A first recess region R1 may be formed along a side surface 711c of the recess sacrificial pattern 711 and between the ohmic layer 251 and the etch stop layer 715. The first recess region R1 may be an edge region of the first sacrificial patterns 710 removed by the etching process. The first trench T1 may be expanded to include the first recess region R1.

Figure 3E:
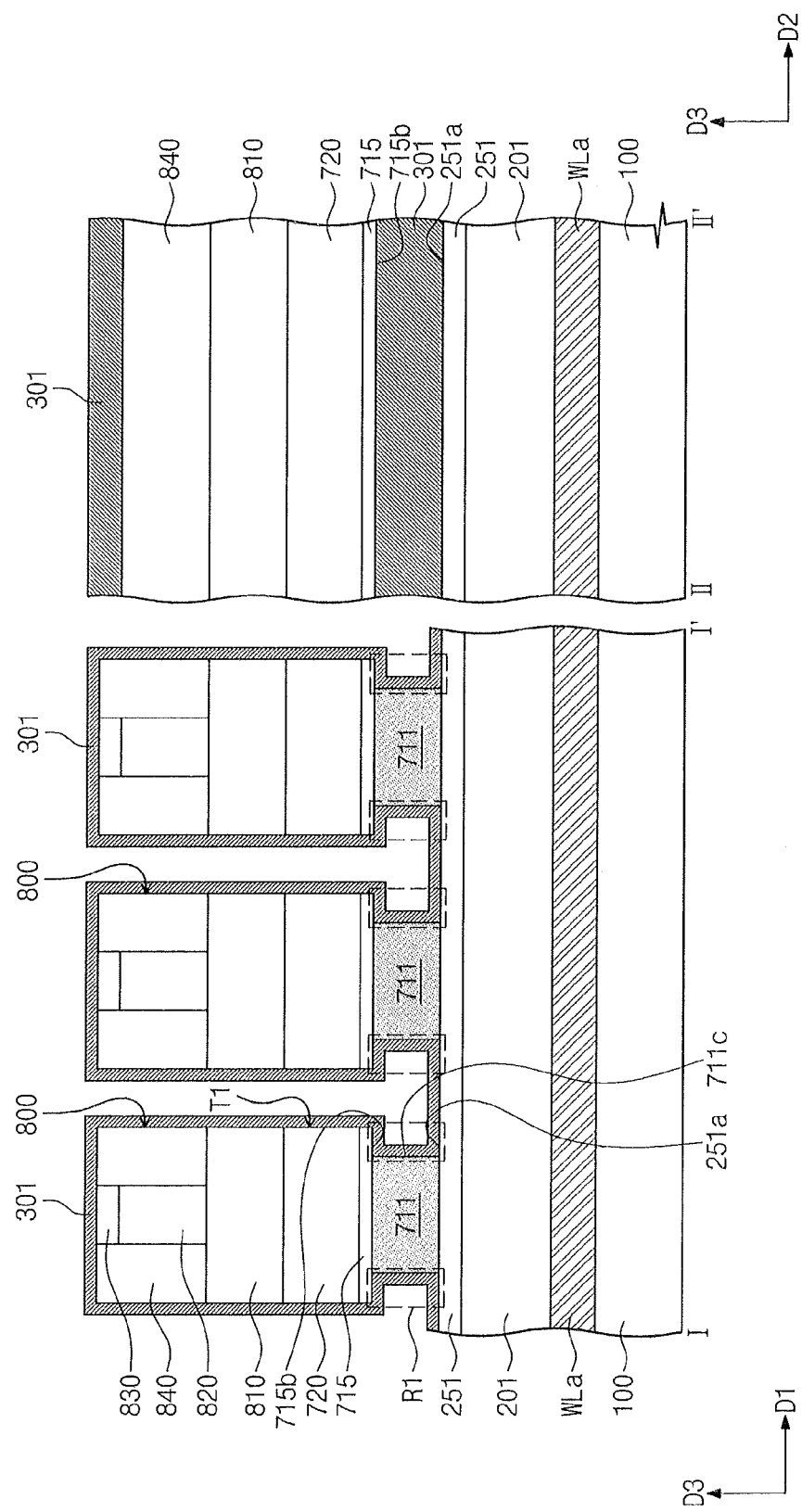

Referring to FIG. 3E, a lower electrode layer 301 may be formed in the first recess region R1 to conformally cover the side surface 711c of the recess sacrificial pattern 711, an exposed portion of the bottom surface 715b of the etch stop layer 715, and a top surface 251a of the ohmic layer 251. For example, the lower electrode layer 301 may be formed of a material (e.g., titanium nitride), which can be formed by a deposition technique with a good step coverage property, conformally (i.e., of a substantially uniform thickness). In the present specification, the expression "substantially uniform thickness" means that a variation in thickness between two elements under consideration is smaller than a variation in thickness of a layer, which is formed by a single deposition process and may be used for one or both of the two elements. For example, the lower electrode layer 301 may be formed to have a thickness ranging from about 1 nm to 10 nm (in particular, of about 4 nm). The lower electrode layer 301 may be formed to have a thickness variation of about 1% or lower. The lower electrode layer 301 may be formed to conformally cover the first trench T1 and the opening 800. For example, the lower electrode layer 301 may include portions covering the top surface 251a of the ohmic layer 251, the side surfaces of the second sacrificial pattern 720, the etch stop layer 715, and the second mask layer 840, and the top surface of the first mask layer 830.

Figure 3F:
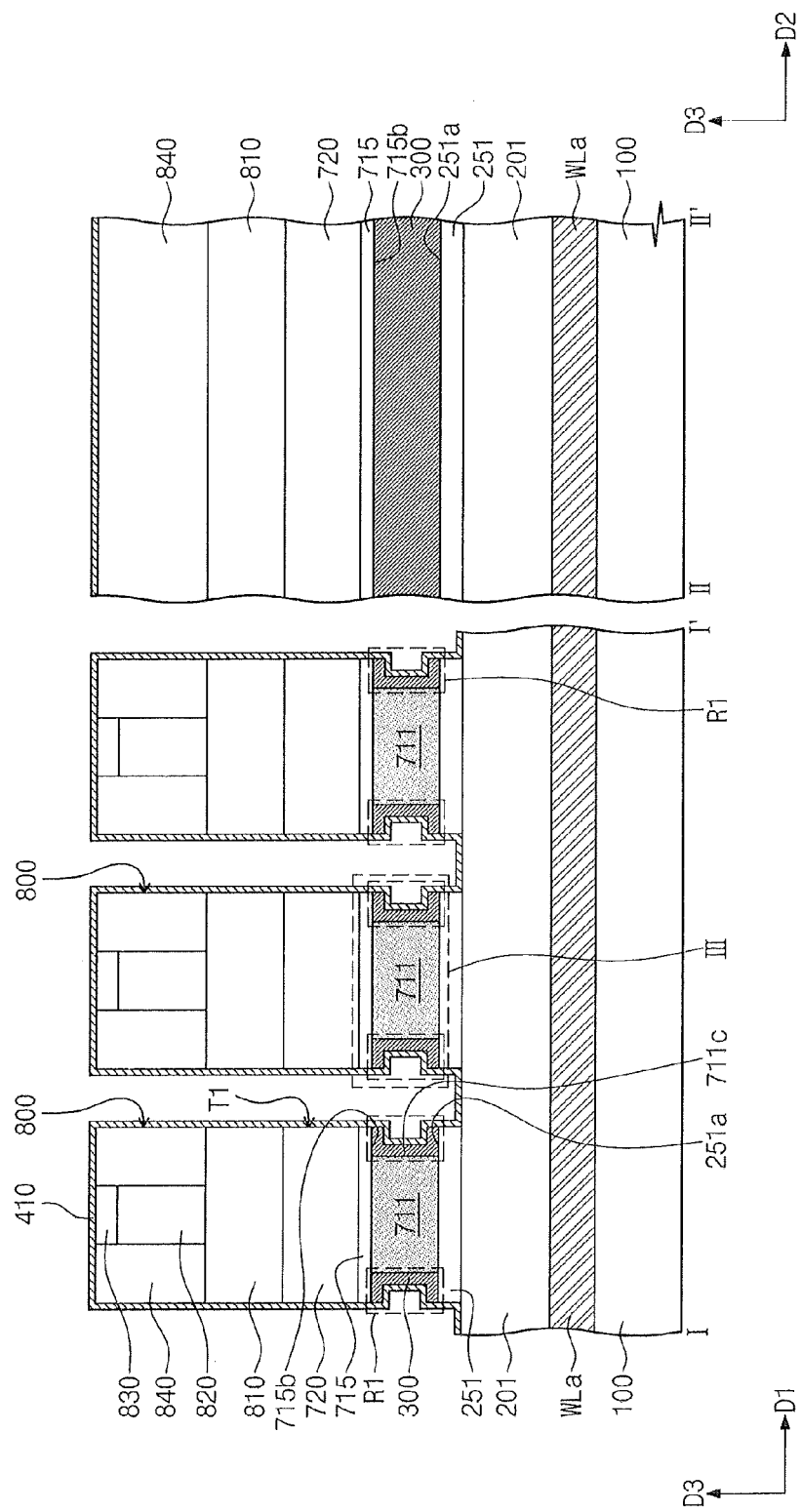
Figure 3G:
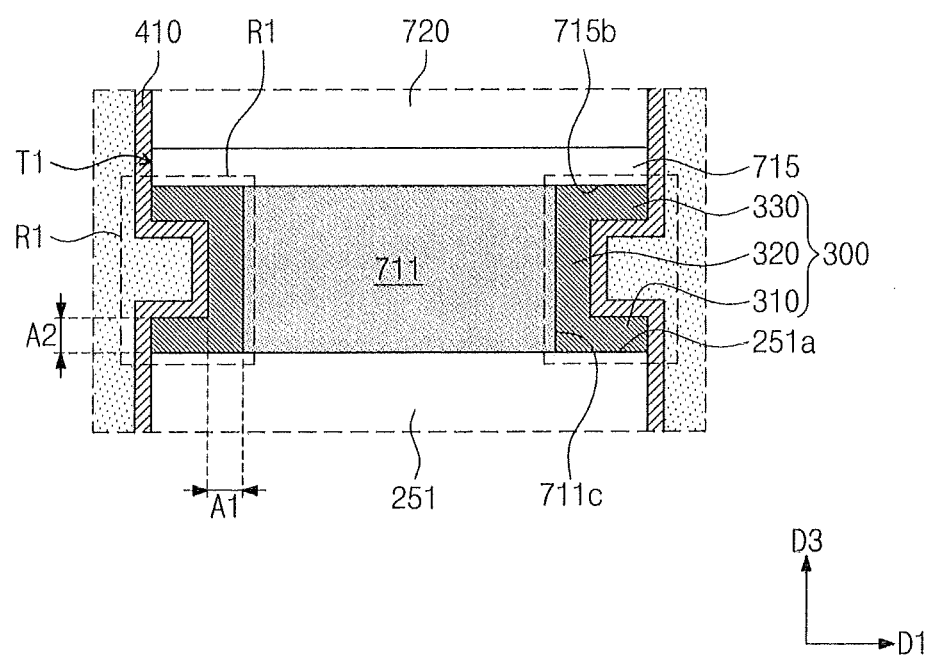

Referring to FIG. 3F and FIG. 3G in conjunction with FIG. 3E, the lower electrode layer 301 may be etched to form the lower electrode pattern 300. For example, an etching process may be performed to remove the lower electrode layer 301 from the side surface of the etch stop layer 715, the side surface of the second sacrificial pattern 720, and the side and top surfaces of the mask layers 810, 820, 830, and 840. In certain embodiments, the ohmic layer 251 exposed by the first and second mask layers 830 and 840 may also be etched in the process of etching the lower electrode layer 301. Since a portion of the lower electrode layer 301 in the first recess region R1 is not exposed in the etching process, the lower electrode pattern 300 may be locally formed in the first recess region R1. The lower electrode pattern 300 may include the horizontal portion 310, the vertical portion 320, and an upper horizontal portion 330. The horizontal portion 310 may be formed on an edge portion of the ohmic layer 251 to partially cover the top surface 251a of the ohmic layer 251. The vertical portion 320 may be formed on the side surface 711c of the recess sacrificial pattern 711 and may extend in the third direction D3. The upper horizontal portion 330 may be formed on the exposed bottom surface 715b of the etch stop layer 715. A plurality of lower electrode patterns 300 may be formed on the recess sacrificial pattern 711. For example, a plurality of the lower electrode patterns 300 may be formed on each of both side surfaces of the recess sacrificial pattern 711 to have bilateral symmetry with respect to a line equidistant therefrom. By contrast, if the lower electrode patterns 300 are patterned using a photolithography process and an etching process, sizes of the lower electrode patterns 300 and its uniformity may be limited by resolution in the photolithography process. However, in the case where, as described with respect to FIG. 3C, the lower electrode layer 301 is formed to have a uniform thickness, the width A1 of the vertical portion 320 may be substantially equal to the thickness A2 of the horizontal portion 310 and the thickness of the upper horizontal portion 330.

For example, in the case where the lower electrode patterns 300 are formed using a photolithography process, the vertical portions 320 of the lower electrode patterns 300 may have a width of about 13.5 nm. However, in the case where a deposition process is used, the vertical portions 320 of the lower electrode patterns 300 may have a width A1 that is about one-third of that of the case when the photolithography process is used. For example, the widths A1 of the vertical portions 320 may range from about 1 nm to 10 nm (in particular, about 4 nm). In example embodiments, each of the thicknesses A2 of the horizontal portions 310 and the widths A1 of the vertical portions 320 may range from about 1 nm to 10 nm (in particular, about 4 nm).

According to example embodiments of the inventive concepts, the lower electrode patterns 300 may be formed using an atomic layer deposition process, and in this case, uniformity in size of the lower electrode patterns 300 may be determined depending on a deposition thickness of the lower electrode layer 301. Accordingly, the lower electrode patterns 300 may have higher size uniformity than that in the photolithography process. Further, the top surfaces 300a of the lower electrode patterns 300 may have substantially the same area. For example, the top surfaces 300a of the lower electrode patterns 300 can be formed in such a way that a ratio of the maximum occupying area to the minimum occupying area is about 1.36. By contrast, in the case where the lower electrode patterns 300 are formed using the photolithography process, the ratio may be about 1.86. That is, according to example embodiments of the inventive concepts, it is possible to improve uniformity in occupying area or size of the lower electrode patterns 300.

The first protection pattern 410 may be formed on the lower electrode patterns 300. The first protection pattern 410 may be deposited to conformally cover the first trench T1. The first protection pattern 410 may include a portion positioned in the first recess region R1. As shown in FIG. 3G, the first protection pattern 410 may be formed proximal to the bottom surface 715b of the etch stop layer 715, the side surface 711c of the recess sacrificial pattern 711, and the top surface 251a of the ohmic layer 251 to cover the lower electrode patterns 300. Referring to FIG. 3F, the first protection pattern 410 may extend to cover the top surface of the selection device layer 201, the side surface of the ohmic pattern 250, the side surface of the etch stop layer 715, the side surface of the second sacrificial pattern 720, and the side and top surfaces of the mask layers 810 and 820. The first protection pattern 410 may be formed using an atomic layer deposition and/or chemical vapor deposition process to have a thickness ranging from about 1 nm to about 5 nm. The first protection pattern 410 may include a material (e.g., silicon nitride) having an etch selectivity with respect to the lower electrode patterns 300.

Figure 3H:
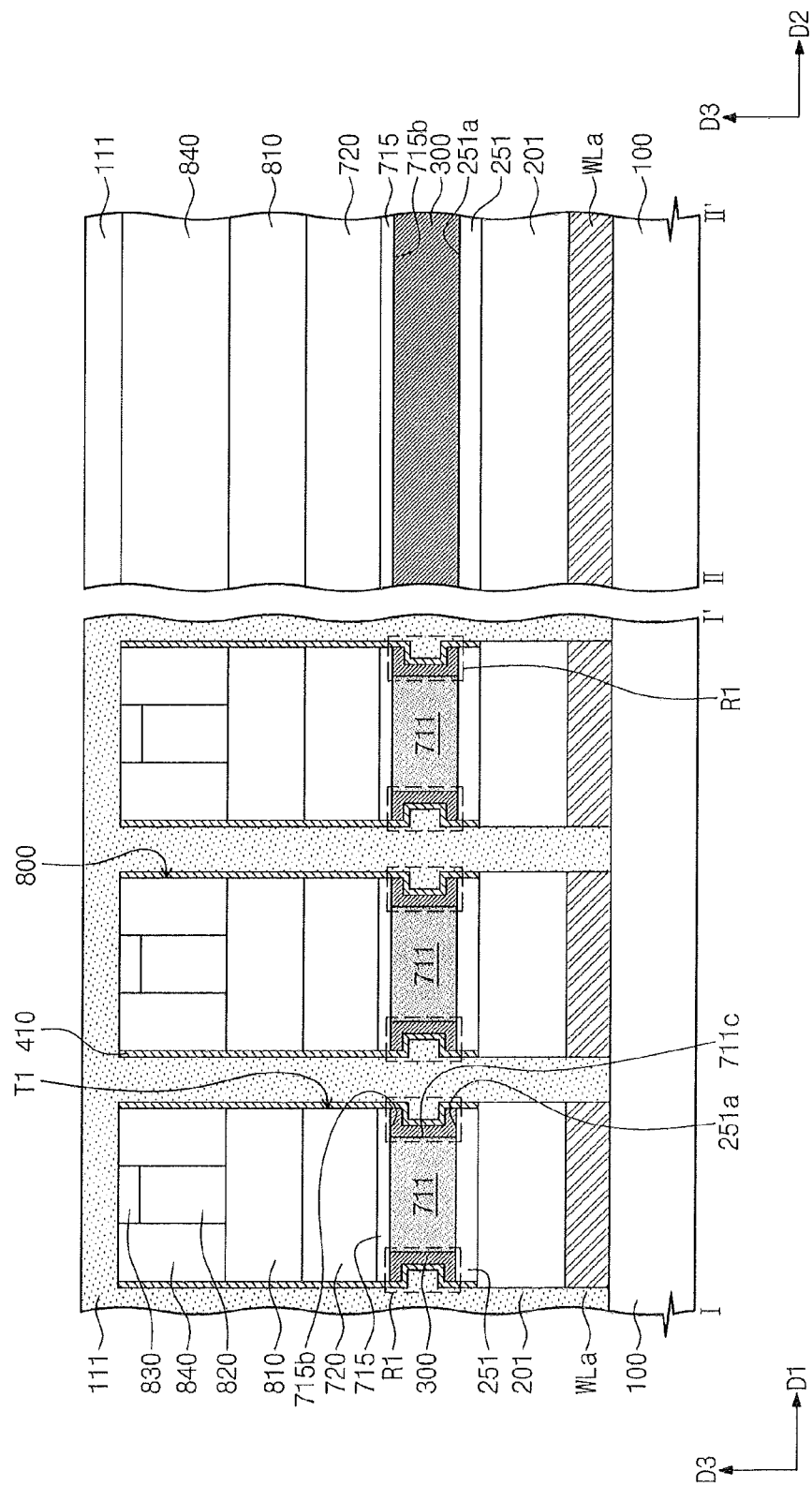

Referring to FIG. 3H, the selection device layer 201 and the word line layer WLa may be etched to extend the first trench T1 into the selection device layer 201 and the word line layer WLa. For example, the first protection pattern 410 may be removed from top surfaces of the first and second mask layers 830 and 840 and the selection device layer 201. The etching process of the selection device layer 201 and the word line layer WLa may be performed using the first and second mask layers 830 and 840 as an etch mask. The first trench T1 may be formed to expose the top surface of the substrate 100. Alternatively, the first trench T1 may be formed to extend into the substrate 100. The first protection pattern 410 in the first recess region R1 may not be exposed to the etching process and thus it may remain in the first recess region R1.

The first insulating pattern 111 may be formed on the substrate 100 to fill the first trench T1. The first insulating pattern 111 may be formed of, or include, an insulating material having a good step coverage property (e.g., Tonen SilaZene (TOSZ), tetraethyl orthosilicate (TEOS), and/or Undoped Silcate Glass (USG)). Accordingly, the first insulating pattern 111 may be Moaned to cover the first protection pattern 410 into the first recess region R1. The lower electrode patterns 300 may not be in contact with the first insulating pattern 111 by the first protection pattern 410 interposed therebetween. In the case where the first protection pattern 410 is omitted, the lower electrode patterns 300 may be exposed to the process for etching the selection device layer 201 and the word line layer WLa and/or the process for deposition of the first insulating pattern 111. According to example embodiments of the inventive concepts, due to the presence of the first protection pattern 410, it is possible to prevent the lower electrode patterns 300 from being oxidized.

Figure 3I:
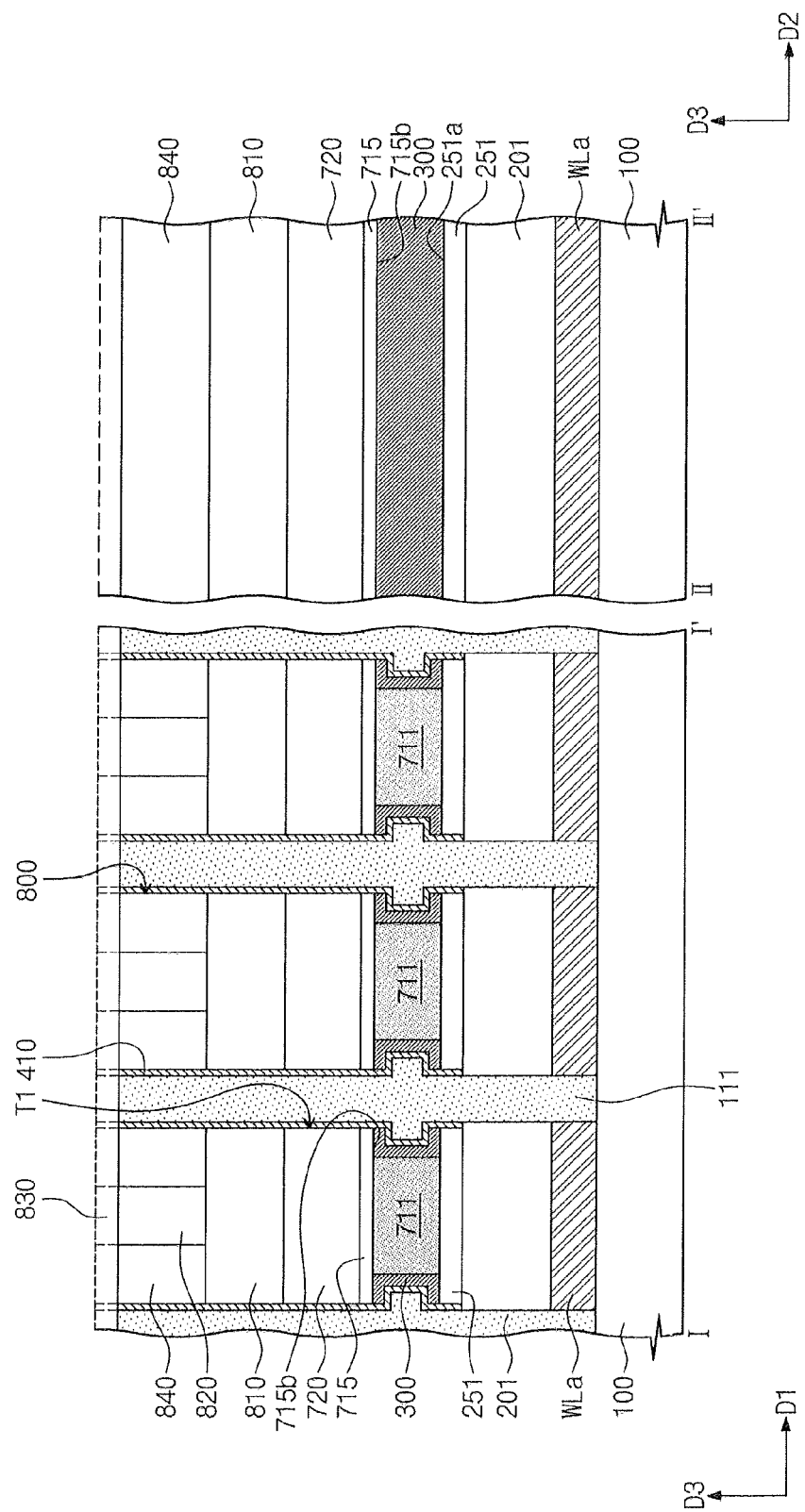

Referring to FIG. 3I, a planarization process may be performed on the first insulating pattern 111 to remove the first mask layer 830. The first mask layer 830 and upper portions of the first insulating pattern 111 and the first protection pattern 410 may be removed during the planarization process. For example, the planarization process may be performed to expose the buffer mask layer 820. Thereafter, the buffer mask layer 820 may be removed to expose the second sacrificial pattern 720. For example, the buffer mask layer 820 may be removed by an ashing process.

Figure 3J:
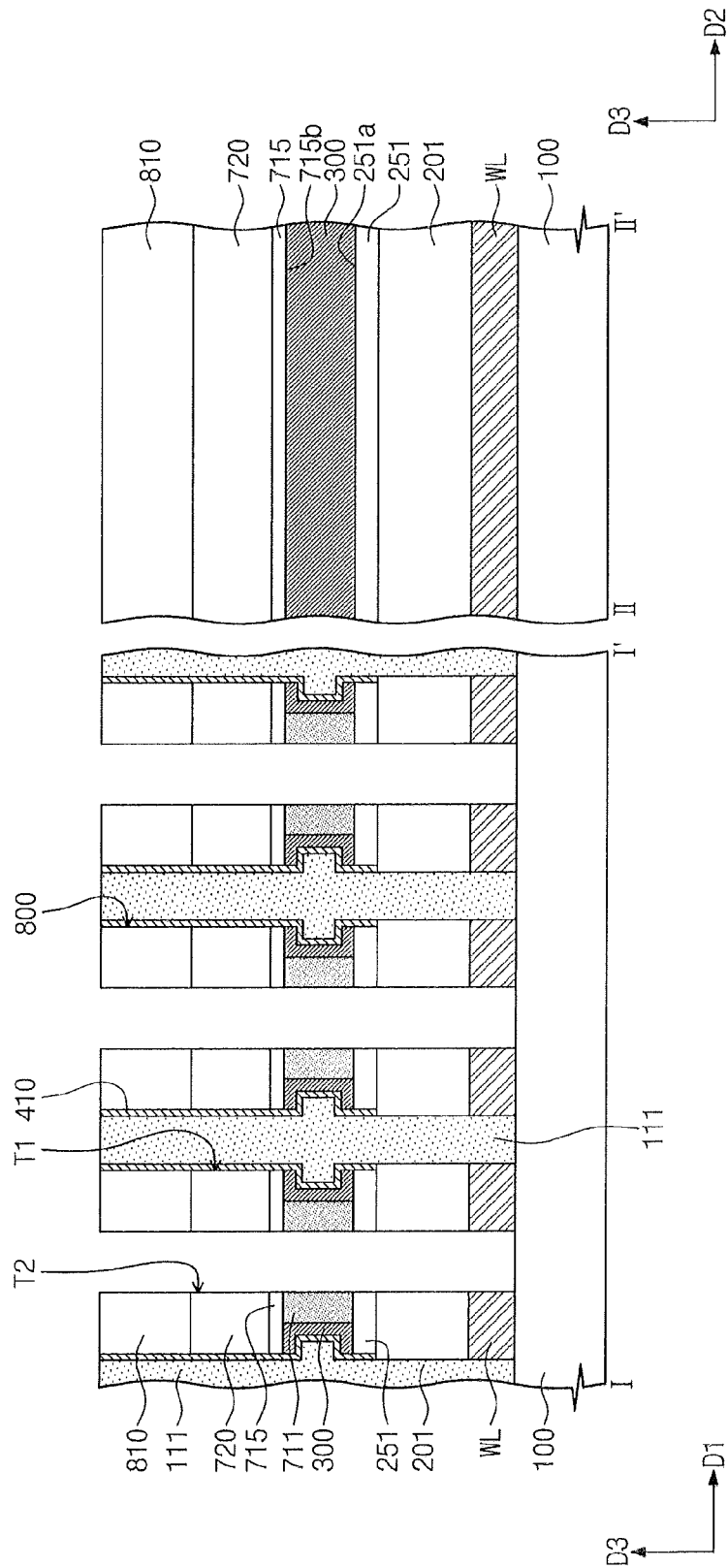

Referring to FIG. 3J, an etching process using the lower mask layer 810 as an etch mask layer may be performed to form the second trench T2. The second trench T2 may be formed to penetrate the second sacrificial pattern 720, the etch stop layer 715, the recess sacrificial pattern 711, the ohmic layer 251, the selection device layer 201, and the word line layer WLa and thereby expose the top surface of the substrate 100. In other example embodiments, the top surface of the substrate 100 may be partially recessed by the second trench T2. The word line layer WLa may be divided into the word lines WL by forming the second trench T2. The word lines WL may be configured to have substantially the same features as that of the previous embodiment described with reference to FIG. 2A through FIG. 2C. For example, the word lines WL may extend parallel to the second direction D2. The second trench T2 may be formed to expose the recess sacrificial pattern 711.

Figure 3K:
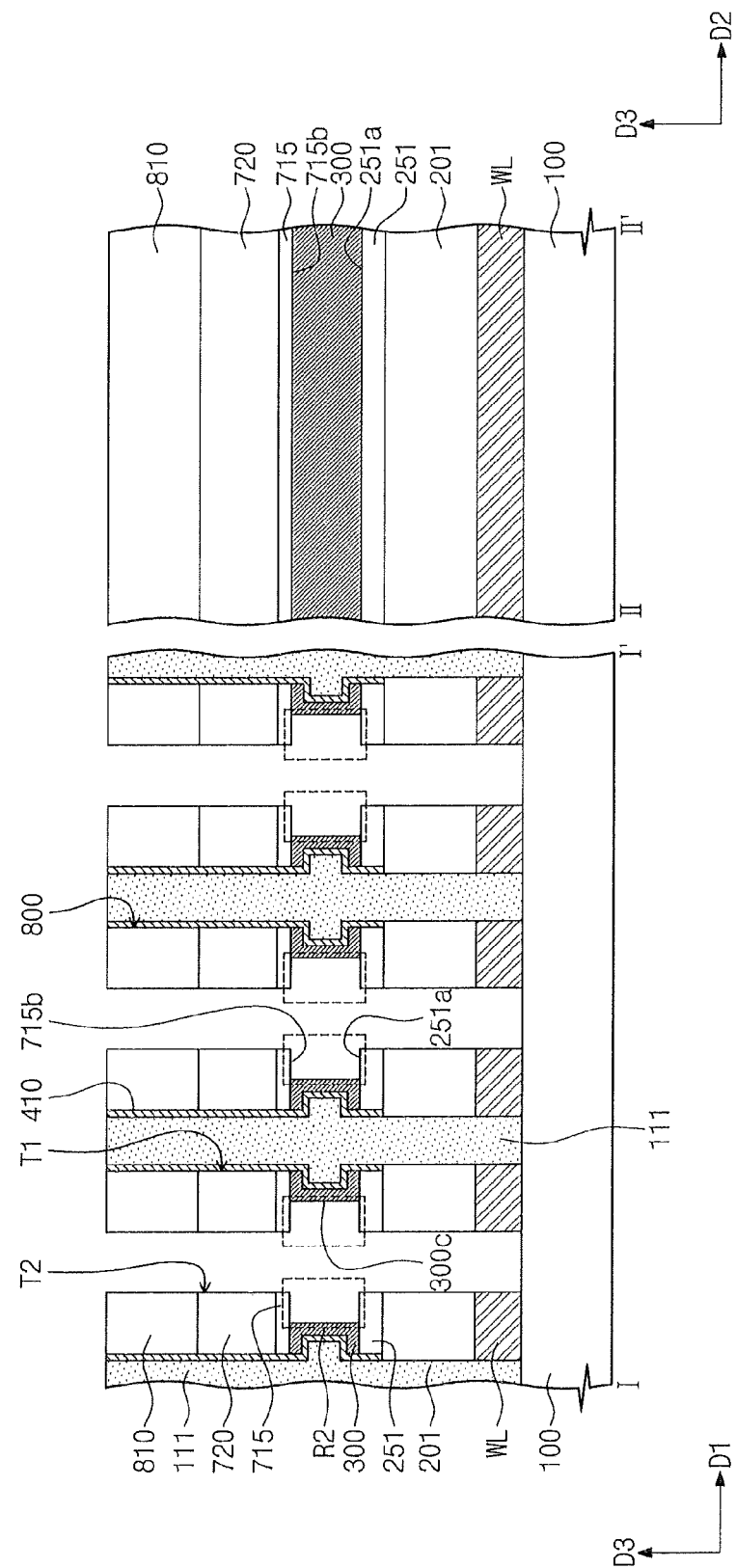

Referring to FIG. 3K in conjunction with FIG. 3J, the recess sacrificial pattern 711 exposed by the second trench T2 may be removed to form the second recess region R2, The removal of the recess sacrificial pattern 711 may be performed using a selective etching process. For example, in the case where the recess sacrificial pattern 711 includes a silicon oxide layer, the recess sacrificial pattern 711 may be removed by an etching process using a fluorine-containing gas. The second recess region R2 may be formed between the ohmic layer 251 and the etch stop layer 715 and may expose the side surfaces 300c of the lower electrode patterns 300, the bottom surface 715b of the etch stop layer 715, and the top surface 251a of the ohmic layer 251. The second trench T2 may be extended or connected to the second recess region R2. A width of the recess sacrificial pattern 711 removed during the formation of the second recess region R2 may be greater than that of the sacrificial pattern 710 removed by an etching process of FIG. 3D. For example, a central axis of the vertical portion 320 shown in FIG. 2A may be positioned at an offset from that of a corresponding one of the memory cells MC. Further, the central axis of the vertical portion 320 provided on one of adjacent ones of the word lines WL may be shifted from that of the memory cell MC in the first direction D1, and the central axis of the vertical portion 320 provided on the other of adjacent ones of the word lines WL may be shifted from that of the memory cell MC in a direction antiparallel to the first direction D1.

Figure 3L:
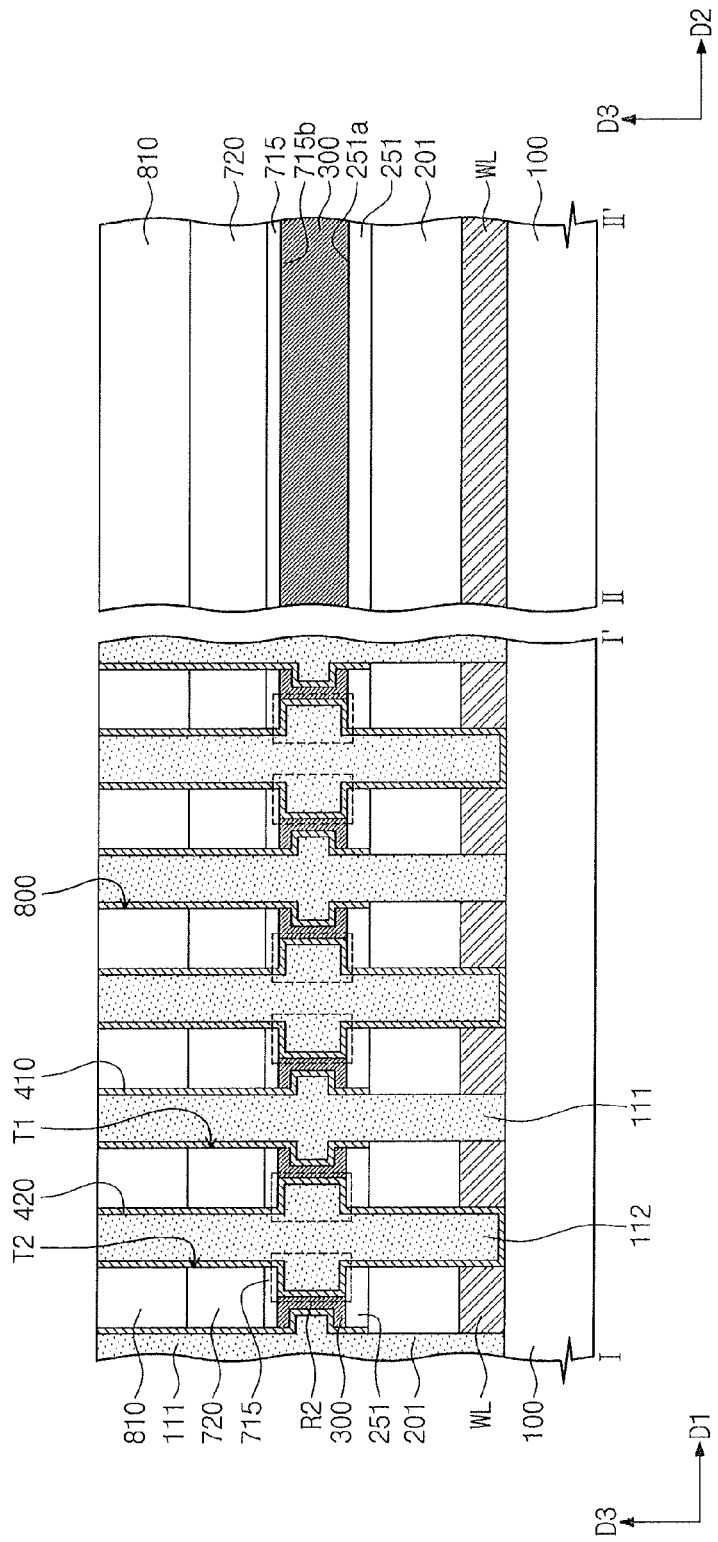

Referring to FIG. 3L, the second protection pattern 420 may be conformally formed in the second trench T2. The second protection pattern 420 may be extended into the second recess region R2 to cover the top surface 251a of the ohmic layer 251, the side surfaces 300c of the lower electrode patterns 300, and the bottom surface 715b of the etch stop layer 715. The second protection pattern 420 may be formed to cover the side surface of the selection device layer 201, the side surface of the ohmic layer 251, the side surface of the etch stop layer 715, the side surface of the second sacrificial pattern 720, the lower and second mask layers 810 and 840. The second protection pattern 420 may be formed using an atomic layer deposition to have a thickness ranging from about 1 nm to about 5 nm. The second protection pattern 420 may be formed of, or include, substantially the same material as the first protection pattern 410 (e.g., silicon nitride).

A second insulating pattern 112 may be deposited on the substrate 100 to fill the second trench T2. The second insulating pattern 112 may be formed to cover the second protection pattern 420 in the second recess region R2. The second insulating pattern 112 may be formed of, or include, substantially the same material as the first insulating pattern 111.

Figure 3M:
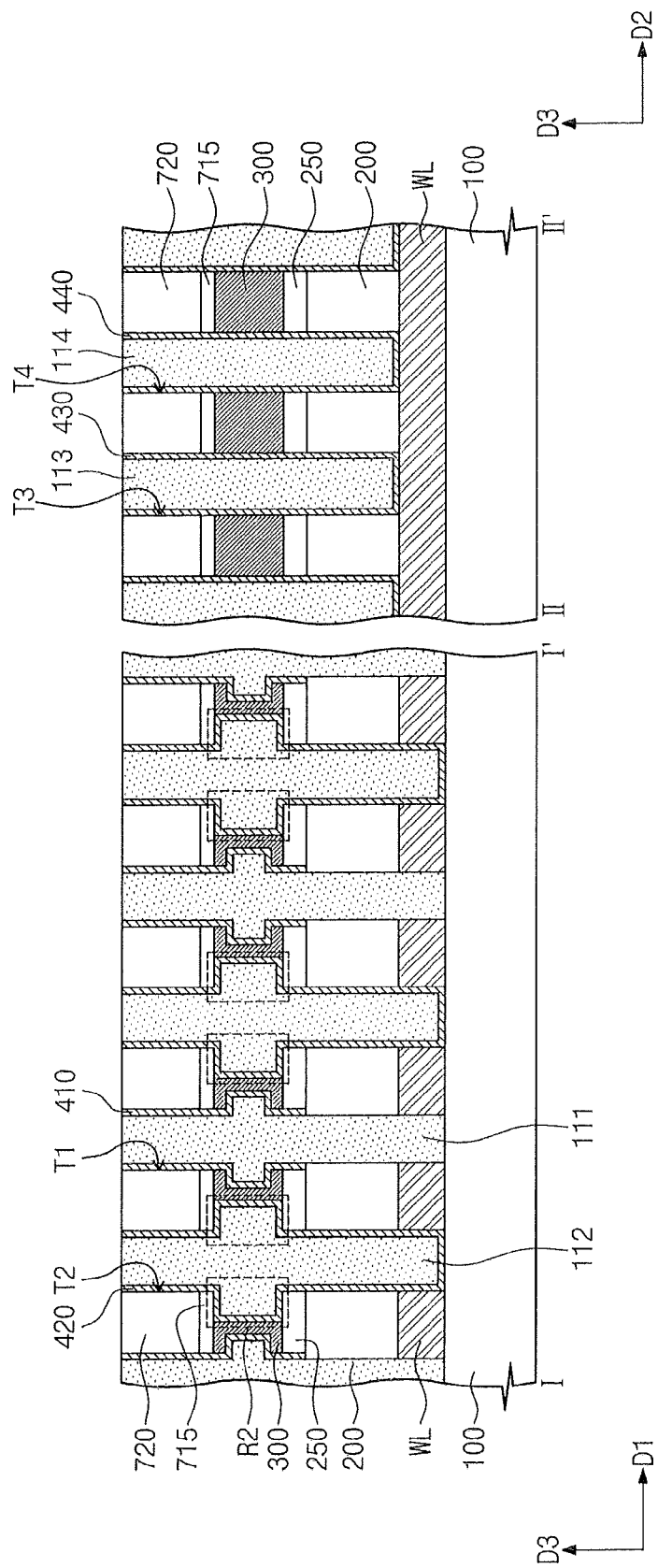

Referring to FIG. 3M, the third and fourth trenches T3 and T4 and third and fourth insulating patterns 113 and 114 respectively may be formed parallel to the first direction D1 to separate the selection elements 200 and the ohmic patterns 250 from each other. The formation of the third trench T3 and the third insulating pattern 113 may be performed using the same or similar patterning process as that for forming the first and second trenches T1 and T2 and the first and second insulating patterns 111 and 112 respectively. For example, mask patterns (not shown) may be formed on the insulating patterns 111 and 112 and the lower mask layer 810, and then, the mask patterns may be used to etch the lower mask layer 810, the second sacrificial pattern 720, the etch stop layer 715, the lower electrode pattern 300, the ohmic layer 251, the selection device layer 201. The third trench T1 may be formed in the second sacrificial pattern 720, the etch stop layer 715, the lower electrode pattern 300, the ohmic pattern 250, and the selection element 200 to expose the word lines WL. A third protection pattern 430 may be formed in the third trench T3 to cover the side surfaces of the second sacrificial pattern 720, the etch stop layer 715, the lower electrode pattern 300, the ohmic patterns 250, and the selection elements 200. The third insulating pattern 113 may be formed in the third trench T3 to cover the third protection pattern 430. Thereafter, the fourth trench T4, the fourth protection pattern 440, and the fourth insulating pattern 114 may be formed adjacent to and between the third trenches T3. The fourth trench T4, the fourth protection pattern 440, and the fourth insulating pattern 114 may be formed by substantially the same or similar method as that for the formation of the third trench T3, the third protection pattern 430, and the third insulating pattern 113. For example, the fourth trench T4 may be formed to penetrate the second sacrificial pattern 720, the etch stop layer 715, the lower electrode pattern 300, the ohmic pattern 250, and the selection element 200 to expose the top surfaces of the word lines WL. The fourth protection pattern 440 and the fourth insulating pattern 114 may be sequentially formed in the fourth trench T4. The word lines WL may not be etched during the formation of the third and fourth trenches T3 and T4. The lower mask layer 810 may be removed by a planarization process to expose the second sacrificial pattern 720. Here, the third and fourth protection patterns 430 and 440 and the insulating patterns 111, 112, 113, and 114 may have tops surfaces coplanar with each other.

Figure 3N:
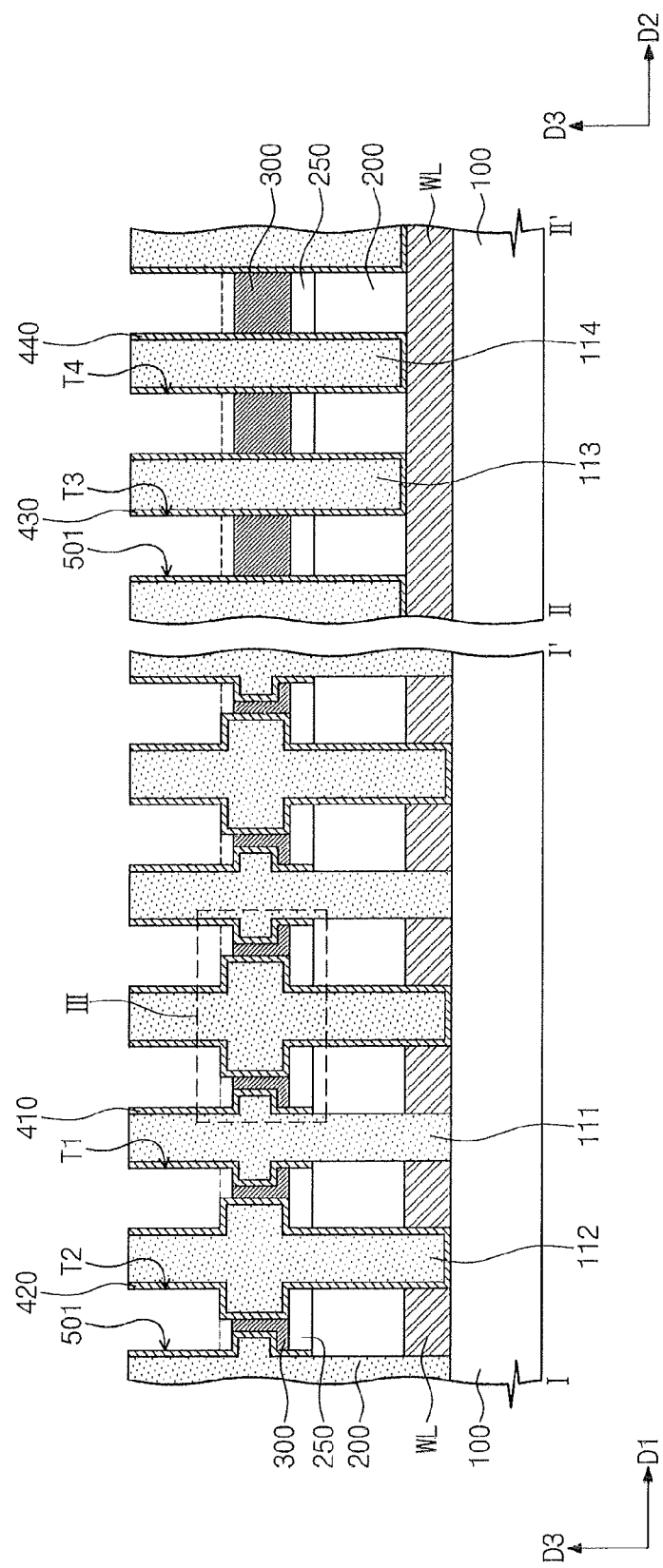
Figure 30:
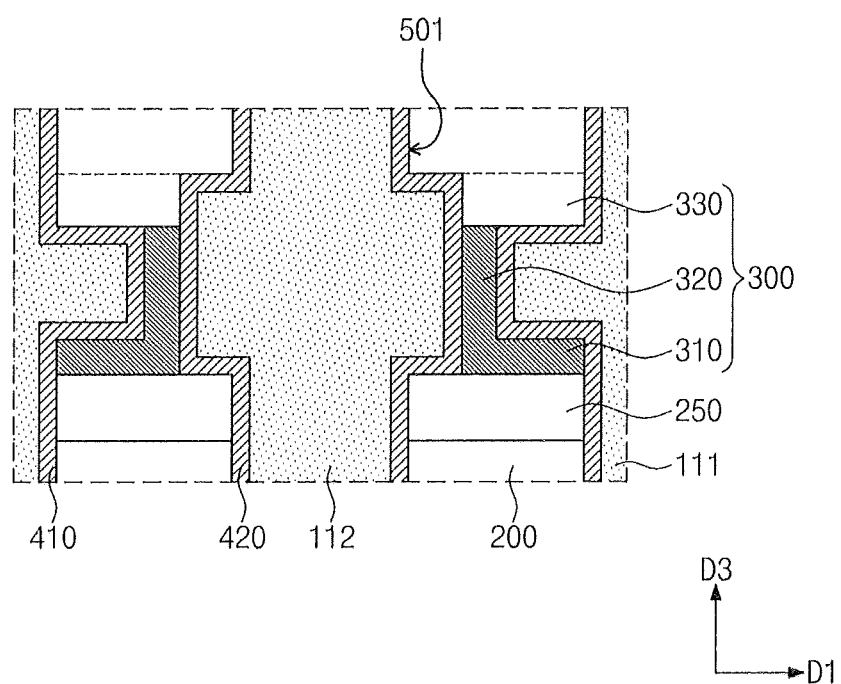

Referring to FIG. 3N and FIG. 3O, the second sacrificial pattern 720 may be removed using, for example, a wet etching process to form a contact hole 501. The contact hole 501 may be formed to have a bottom surface exposing the etch stop layer 715 and a side surface exposing the protection patterns 410, 420, 430, and 440. Thereafter, the etch stop layer 715 may be removed by an etching process, and thus, the top surfaces of the upper horizontal portions 330 of the lower electrode patterns 300 and the first and second protection patterns 410 and 420 respectively may be exposed. The etching of the etch stop layer 715 may be performed to etch the upper horizontal portions 330 of the lower electrode patterns 300 positioned on the first and second protection patterns 410 and 420 respectively. However, the vertical portions 320 of the lower electrode patterns 300 may not be removed by the etching of the etch stop layer 715.

Figure 3P:
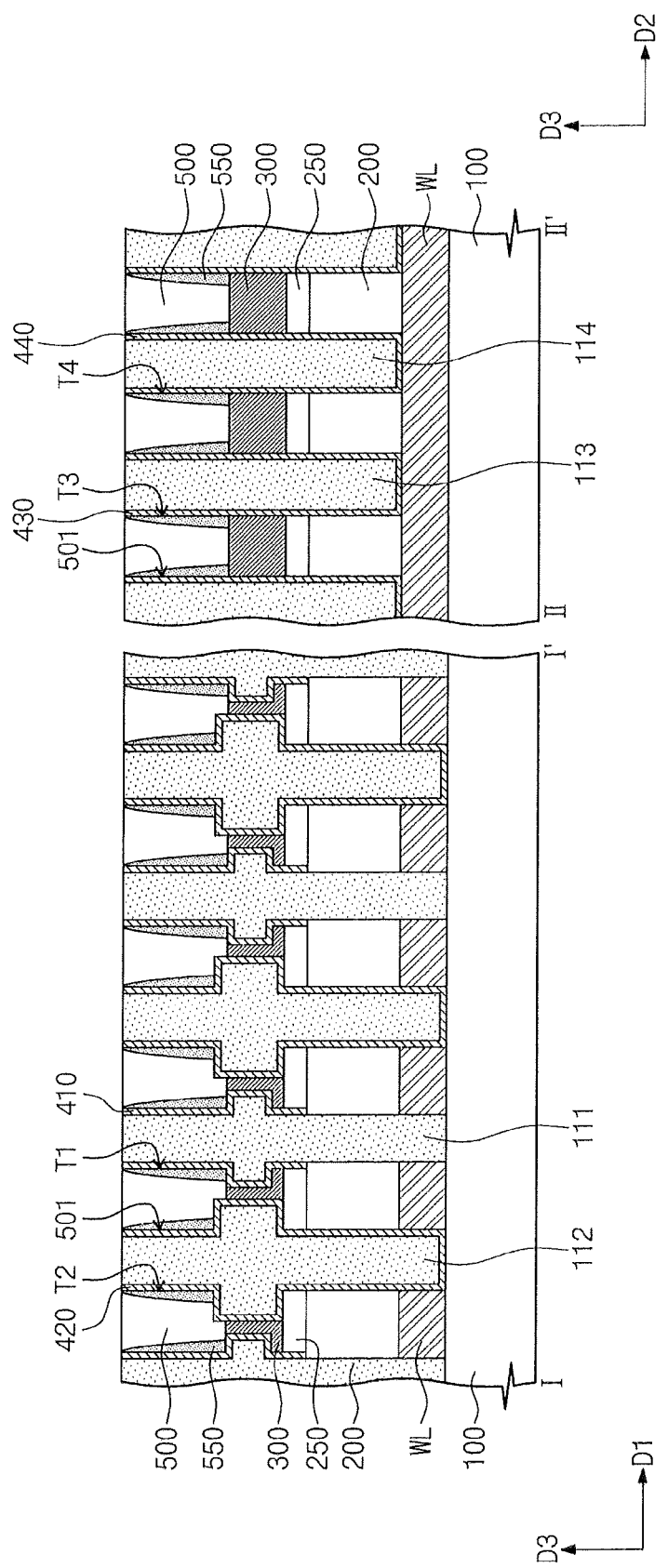

Referring to FIG. 3P, the spacer pattern 550 may be formed on a side surface of the contact hole 501. For example, the formation of the spacer pattern 550 may include conformally forming a spacer layer (not shown) in the contact hole 501 and etching the spacer layer. The spacer pattern 550 may include a silicon-containing material (e.g., silicon oxide). The spacer pattern 550 may include at least one of insulating materials or high-k dielectric materials, which were described with reference to FIG. 2A through FIG. 2C, The spacer pattern 550 may be formed to have a width ranging from about 2 nm to 5 nm.

The phase-changeable pattern 500 may be formed in the contact hole 501. The phase-changeable pattern 500 may be formed to have substantially the same or similar features as that described with reference to FIG. 2A through FIG. 2C. The phase-changeable pattern 500 may include at least one of the phase-changeable materials previously enumerated in FIG. 1. The phase-changeable pattern 500 may be formed in such a way that a portion of the bottom surface 500b is in contact with the top surfaces 300a of the lower electrode patterns 300. Another portion of the bottom surface 500b may be in contact with the first and second protection patterns 410 and 420 respectively. In example embodiments, each of the lower electrode patterns 300 may be formed to have an "L"-shaped section. Since the vertical portions 320 of the lower electrode patterns 300 are formed using a deposition process, the width A1 of the vertical portions 320 may be about one-third of that of the case that the photolithography process. Accordingly, the contact area of the phase-changeable pattern 500 and the lower electrode pattern 300 can be reduced. This makes it possible to reduce an amount of current required for the program operation of the semiconductor device.

The phase-changeable pattern 500 may be formed using one of sputtering, chemical vapor deposition, or physical vapor deposition methods. In example embodiments, the formation of the phase-changeable pattern 500 may include forming a phase-changeable material layer (not shown) to cover the contact hole 501 and the insulating patterns 111, 112, 113, and 114 and then planarizing the phase-changeable material layer to expose the insulating patterns 111, 112, 113, and 114.

Figure 3Q:
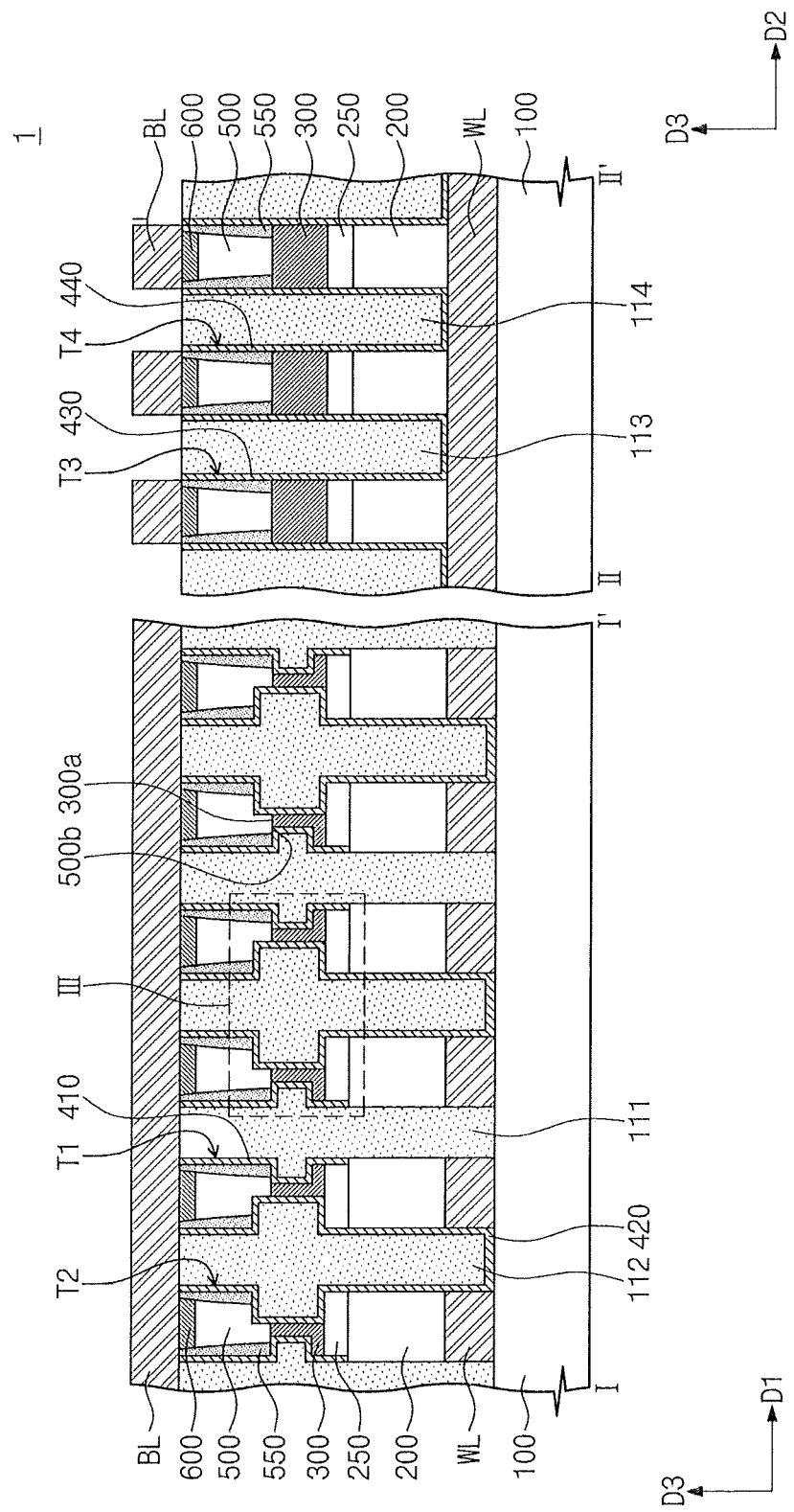

Referring to FIG. 3Q, an etching process may be performed to remove an upper portion of the phase-changeable pattern 500, and then, the upper electrode pattern 600 may be formed on the phase-changeable pattern 500. The upper electrode pattern 600 may include at least one metal nitride (e.g., titanium nitride). The bit lines BL may be formed on the insulating patterns 111, 112, 113, and 114. The bit lines BL may be in contact with the upper electrode patterns 600 and extend parallel to the second direction D2. A material contained in the bit lines BL may be unintentionally reacted with a material contained in the phase-changeable pattern 500, but according to example embodiments of the inventive concepts, the upper electrode pattern 600 may be interposed between the phase-changeable patterns 500 and the bit lines BL to prevent such an unintended reaction between the phase-changeable pattern 500 and the bit lines BL. Accordingly, it is possible to prevent the semiconductor device 1 from being deteriorated.

Hereinafter, a semiconductor device according to other example embodiments of the inventive concepts will be described. For the sake of brevity, the elements and features of this example that are similar to those previously shown and described will not be described in much further detail.

Figure 4A:
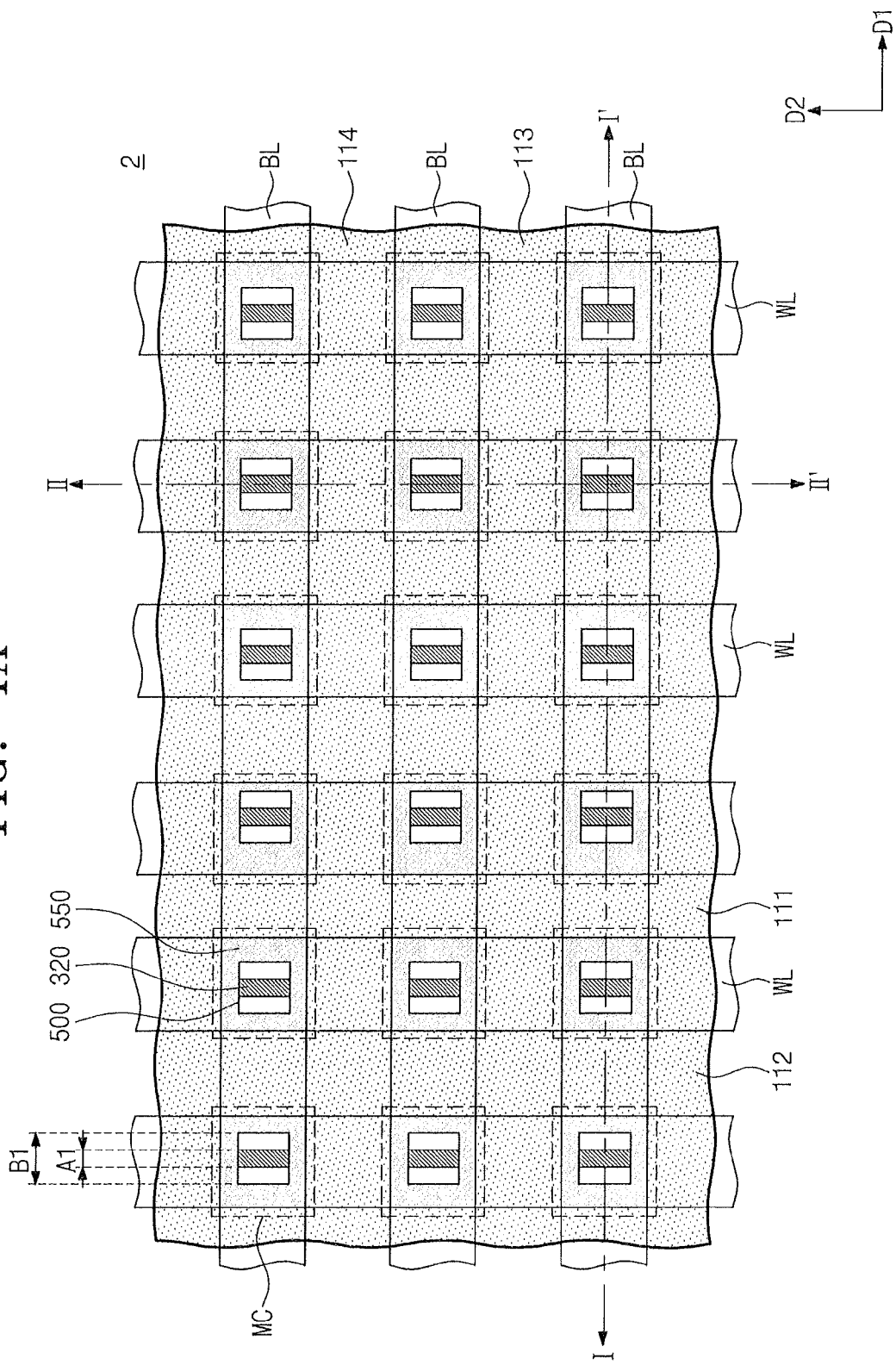
FIG. 4A is a plan view illustrating a semiconductor device according to other example embodiments of the inventive concepts.
Figure 4C:
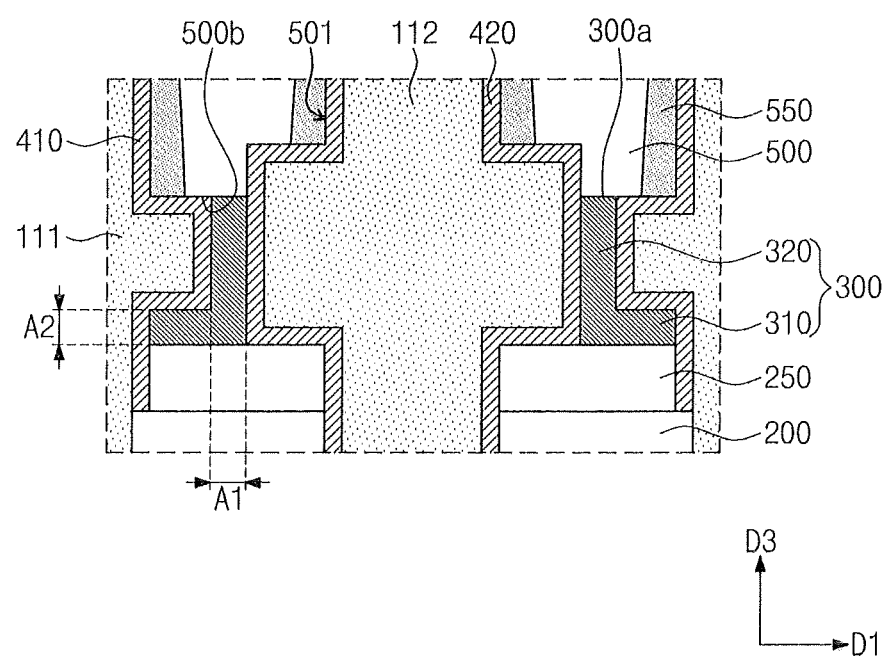
FIG. 4C is an enlarged view of a region III of FIG. 4B.

FIG. 4A is a plan view illustrating a semiconductor device according to other example embodiments of the inventive concepts. FIG. 4B is a sectional view taken along lines I-I' and II-II' of FIG. 4A, and FIG. 4C is an enlarged view of a region III of FIG. 4B.

Referring to FIG. 4A and FIG. 4B, a semiconductor device 2 may include the word lines WL, the bit lines BL, and the memory cells MC on the substrate 100. The memory cells MC may be located at respective intersections of the word lines WL and the bit lines BL. The memory cells MC may be defined or delimited by insulating patterns 111, 112, 113, and 114. The insulating patterns 111, 112, 113, and 114 may be interposed on the substrate 100 and between the word lines WL to enclose the memory cells MC. In each pair of two adjacent word lines WL, the memory cells MC may also be formed to have the bilateral symmetry with respect to a line equidistant therefrom. Each of the memory cells MC may include the selection element 200, the ohmic pattern 250, the lower electrode pattern 300, the protection patterns 410, 420, 430, and 440, the phase-changeable pattern 500, the spacer pattern 550, and the upper electrode pattern 600. The semiconductor device 2 may be fabricated by substantially the same or similar method as that described with reference to FIG. 3A through FIG. 3Q.

The lower electrode pattern 300 may be provided on the ohmic pattern 250 to be in contact with the phase-changeable pattern 500. As shown in FIG. 4B, the lower electrode pattern 300 may have an "L"-shaped section. As shown in FIG. 4C, the lower electrode pattern 300 may include the horizontal portion 310 and the vertical portion 320 vertically extending from the horizontal portion 310. A width A1 of the vertical portion 320 may be substantially equal to a thickness A2 of the horizontal portion 310. The vertical portion 320 may have an occupying area smaller than that of the lower electrode pattern 300. The vertical portion 320 may have substantially the same central axis as that of the memory cell MC therewith. For example, when the first recess region R1 is formed using the method described with reference to FIG. 3D, a width of the first sacrificial pattern 710 to be removed by the etching process of FIG. 3D may be adjusted to control positions of the vertical portion 320. As an example, a width of the first sacrificial pattern 710 to be removed by the etching process of FIG. 3D may be substantially equal to a width of the recess sacrificial pattern 711 to be removed by the etching process of FIG. 3J.

Hereinafter, the memory cells MC and the lower electrode patterns 300 will be described in more detail.

As shown in FIG. 4A, the memory cells MC may be two-dimensionally arranged along both the first and second directions D1 and D2 respectively. When viewed in a plan view, the vertical portions 320 of the memory cells MC may be disposed to form rectangular shapes as shown in FIG. 4A. The vertical portions 320 of the memory cells MC may be spaced apart from each other by substantially the same distance in the second direction D2. The vertical portions 320 may be formed to be centered within the memory cells MC, and thus, the vertical portions 320 of the memory cells MC may be spaced apart from each other by substantially the same distance in the first direction D1. Each of the memory cells MC may have substantially the same occupying area and shape. The top surfaces of the vertical portion 320 of the lower electrode patterns 300 may have substantially the same occupying area. This makes it possible to improve uniformity in size of the vertical portion 320 and reduce an amount of current required for a program operation of the semiconductor device 2.

Referring to FIGS. 4B and 4C in conjunction with FIG. 4A, the memory cells MC on each pair of two adjacent word lines WL may have the bilateral symmetry with respect to a line equidistant therefrom. The protection patterns 410, 420, 430, and 440 may be interposed between the lower electrode patterns 300 and the insulating patterns 111, 112, 113, and 114. The phase-changeable patterns 500 may be provided on the lower electrode patterns 300, respectively. The top surfaces 300a of the vertical portions 320 of the lower electrode patterns 300 may have an area smaller than the bottom surfaces 500b of the phase-changeable patterns 500. The bottom surfaces 500b of the phase-changeable patterns 500 may be in contact with the top surfaces 300a of the vertical portions 320 of the lower electrode patterns 300, and thus, contact areas between the phase-changeable patterns 500 and the lower electrode patterns 300 can be reduced. Accordingly, it is possible to further reduce an amount of current required for a program operation of the semiconductor device 2.

Hereinafter, a semiconductor device according to still other example embodiments of the inventive concepts will be described. For the sake of brevity, the elements and features of this example that are similar to those previously shown and described will not be described in much further detail.

Figure 5B:
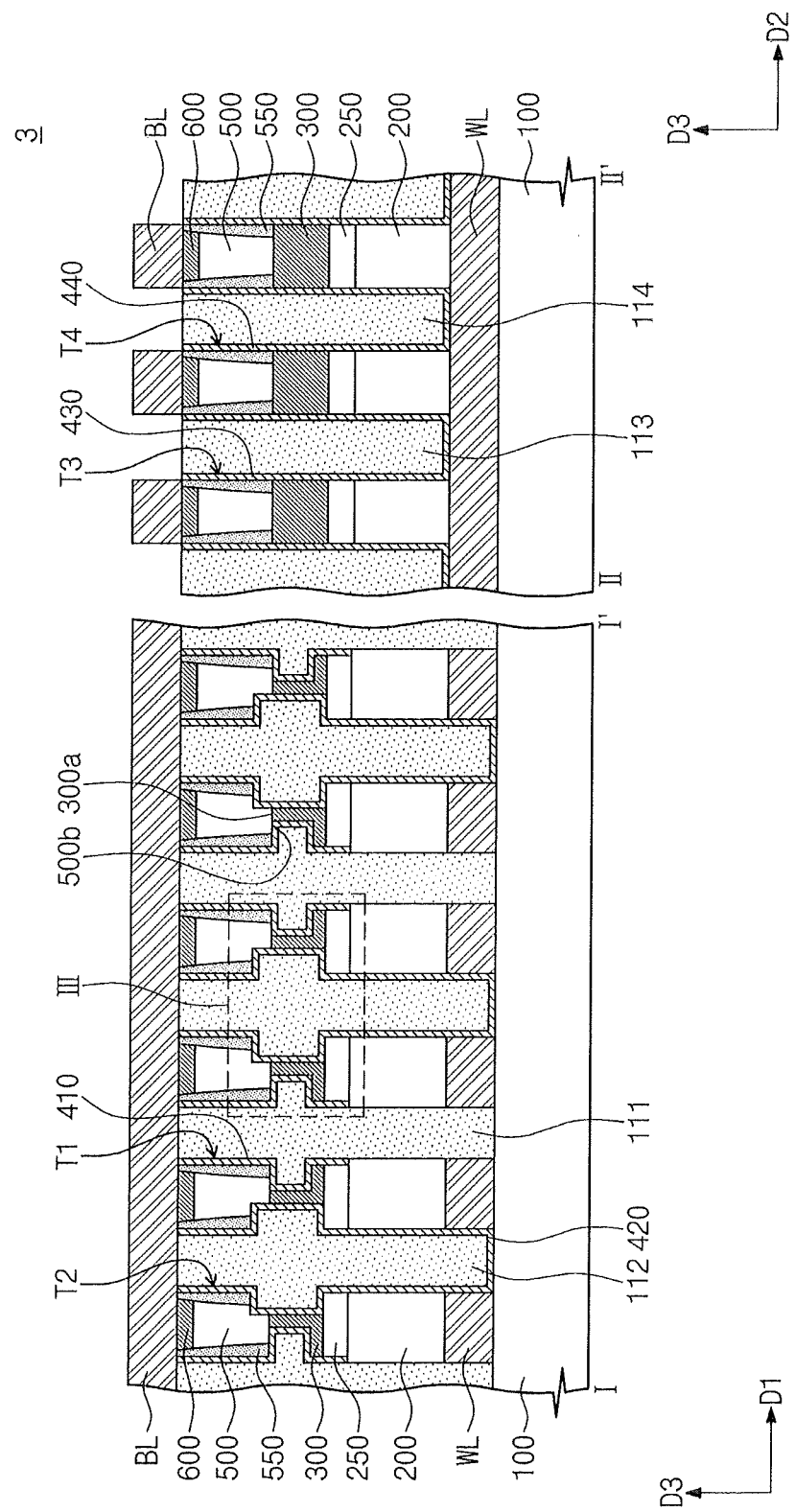
FIG. 5B is a sectional view taken along lines I-I' and II-II' of FIG. 5A.
Figure 5C:
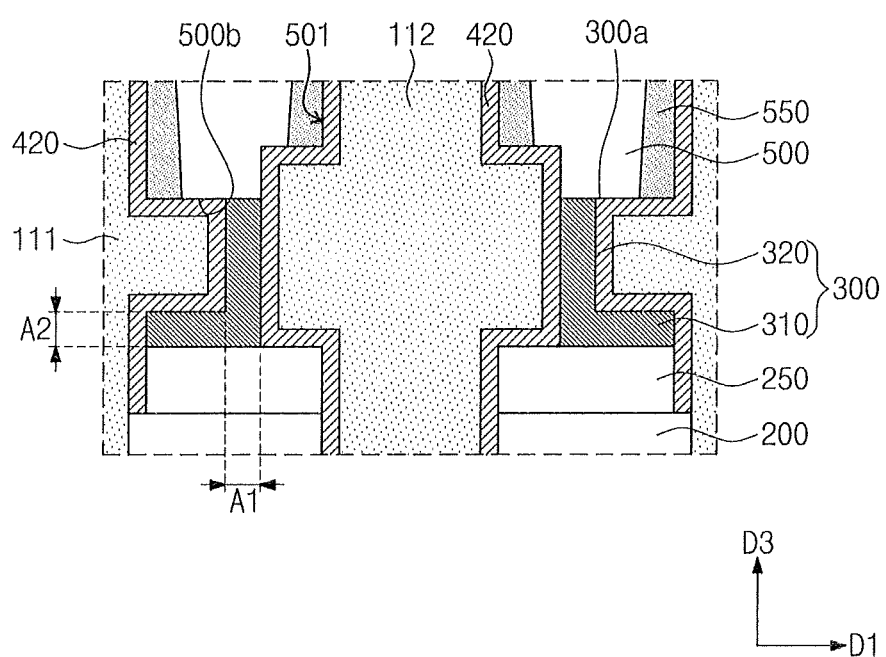
FIG. 5C is an enlarged view of a region III of FIG. 5B.

FIG. 5A is a plan view illustrating a semiconductor device according to another example embodiments of the inventive concepts. FIG. 5B is a sectional view taken along lines I-I' and II-II' of FIG. 5A, and FIG. 5C is an enlarged view of a region III of FIG. 5B.

Referring to FIG. 5A and FIG. 5B, a semiconductor device 3 may include the word lines WL, the bit lines BL, and the memory cells MC on the substrate 100. The memory cells MC may be defined or delimited by insulating patterns 111, 112, 113, and 114. Each of the memory cells MC may include the selection element 200, the ohmic pattern 250, the lower electrode pattern 300, the phase-changeable pattern 500, the spacer pattern 550, the protection patterns 410, 420, 430, and 440, and the upper electrode pattern 600. The semiconductor device 3 may be fabricated by substantially the same or similar method as that described with reference to FIG. 3A through FIG. 3Q.

Hereinafter, the memory cells MC will be described.

The lower electrode patterns 300 may be disposed on the ohmic patterns 250 to be in contact with the phase-changeable patterns 500. The lower electrode patterns 300 may have an "L"-shaped section. In each pair of two adjacent columns, the lower electrode patterns 300 may be provided to have the bilateral symmetry with respect to a line equidistant therefrom. The lower electrode patterns 300 may include the horizontal portions 310 and the vertical portions 320 vertically extending from the horizontal portions 310. The widths A1 of the vertical portions 320 may be substantially equal to the thicknesses A2 of the horizontal portions 310. The vertical portions 320 may be an occupying area smaller than that of the memory cells MC. A central axis of the vertical portion 320 of the lower electrode pattern 300 may be laterally positioned at a position shifted from that of the memory cell MC. When the first recess region R1 is formed using the method described with reference to FIG. 3D, positions of the vertical portions 320 can be positioned by adjusting the process of etching the first sacrificial pattern 710. As an example, a width of the first sacrificial pattern 710 to be removed by the etching process of FIG. 3D may be larger than a width of the recess sacrificial pattern 711 to be removed by the etching process of FIG. 3J.

As shown in FIG. 5A, the memory cells MC may be two-dimensionally arranged along both the first and second directions D1 and D2. When viewed in a plan view, the vertical portions 320 of the memory cells MC may be disposed to form a rectangular arrangement. The vertical portions 320 of the memory cells MC may be spaced apart from each other by substantially the same distance in the second direction D2.

Hereinafter, a method of fabricating a semiconductor device according to other example embodiments of the inventive concepts will be described. For the sake of brevity, the elements and features of this example that are similar to those previously shown and described will not be described in much further detail.

FIG. 6A through FIG. 6C and FIG. 6E through FIG. 6F are sectional views illustrating a method of fabricating a semiconductor device, according to other example embodiments of the inventive concepts. FIG. 6D and FIG. 6G are enlarged views of regions III of FIG. 6C and FIG. 6F, respectively.

Figure 6A:
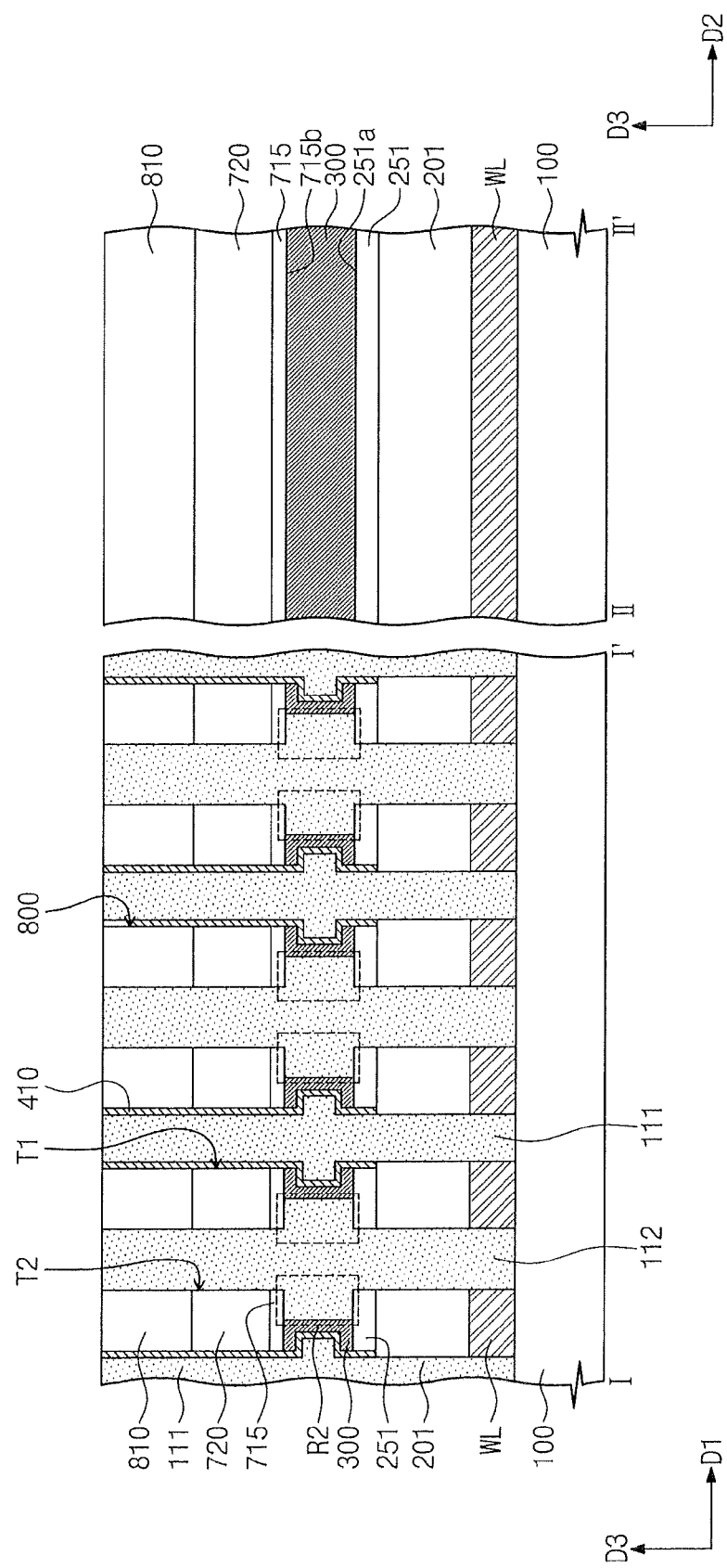
FIG. 6A through FIG. 6C and FIG. 6E through FIG. 6F are sectional views illustrating a method of fabricating a semiconductor device, according to other example embodiments of the inventive concepts.

Referring to FIG. 6A, the second trench T2 and the second insulating pattern 112 may be formed. For example, as previously described with reference to FIG. 3A through FIG. 3K, the word lines WL, the selection device layer 201, the ohmic layer 251, the lower electrode patterns 300, the etch stop layer 715, the second recess region R2, and the lower mask layer 810 may be formed on the substrate 100. The second trench T2 may be formed using substantially the same method as that described with reference to FIG. 3K. For example, the second trench T2 may be extended or connected to the second recess region R2. In the present embodiment, the second protection pattern 420 of FIG. 3L may be omitted. The second insulating pattern 112 may be formed to fill the second trench T2 and the second recess region R2.

Figure 6B:
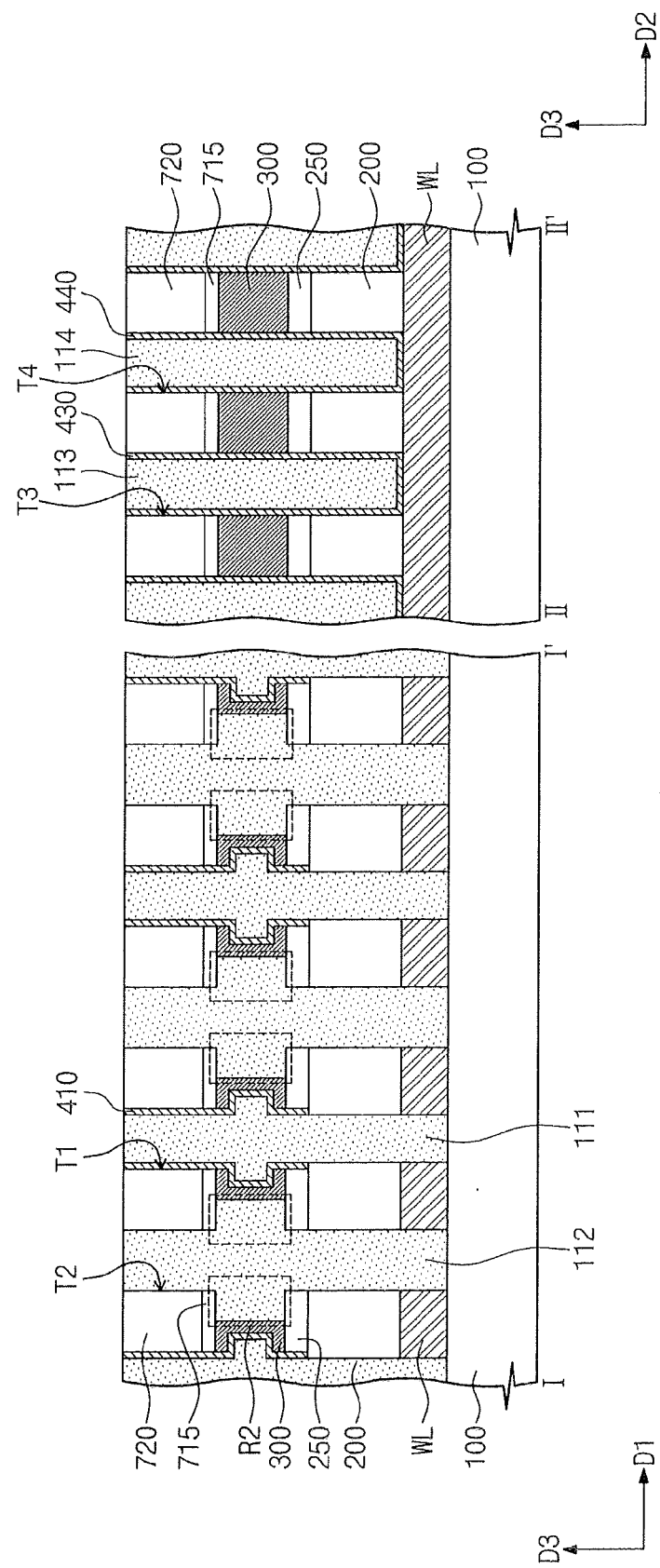

Referring to FIG. 6B, the third and fourth trenches T3 and T4 and the third and fourth insulating patterns 113 and 114 may be formed parallel to the first direction D1, and thus, the separate the selection elements 200 and the ohmic patterns 250 may be separated from each other. The third trench T3 and the third insulating pattern 113 may be formed by substantially the same or similar method as that of the previous embodiments described with reference to FIG. 3M. The third and fourth protection patterns 430 and 440 may be formed in the third and fourth trenches T3 and T4, respectively. The third and fourth insulating patterns 113 and 114 may be formed on the third and fourth protection patterns 430 and 440, respectively. In certain embodiments, the third and fourth protection patterns 430 and 440 may be omitted.

Figure 6C:
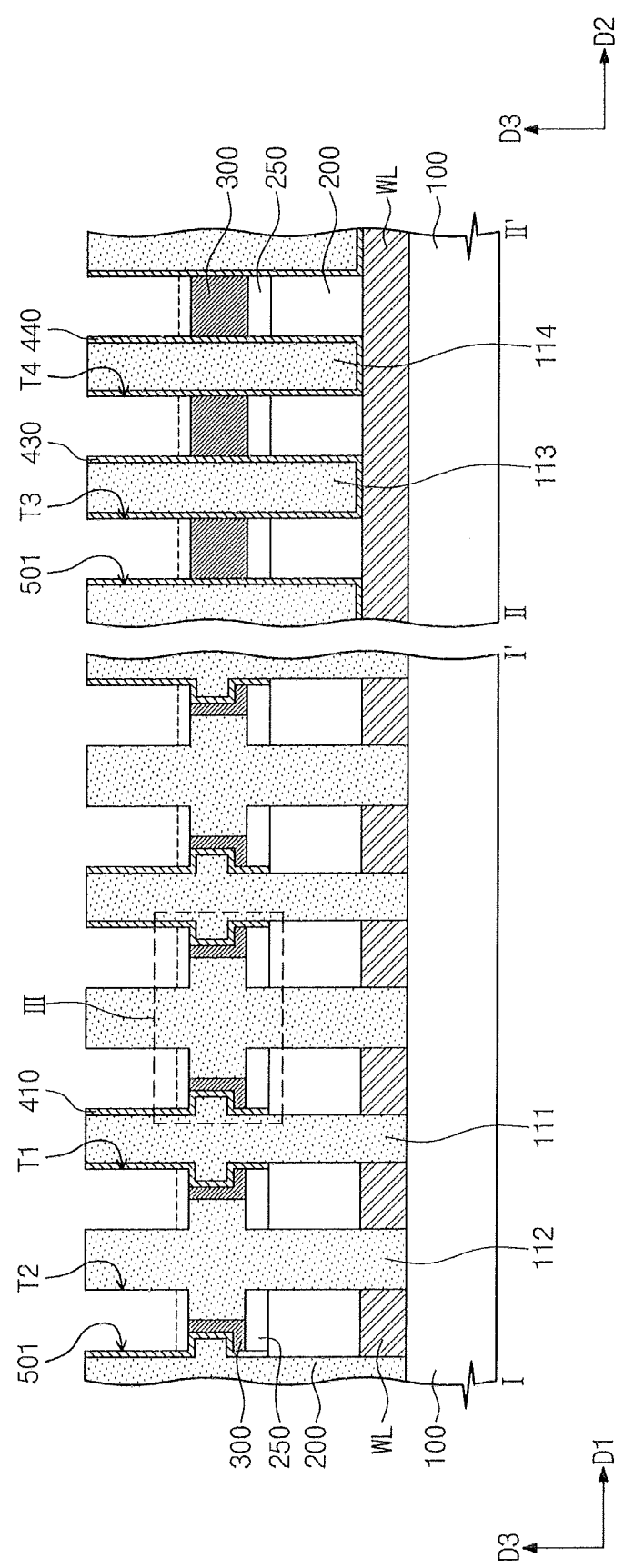
Figure 6D:
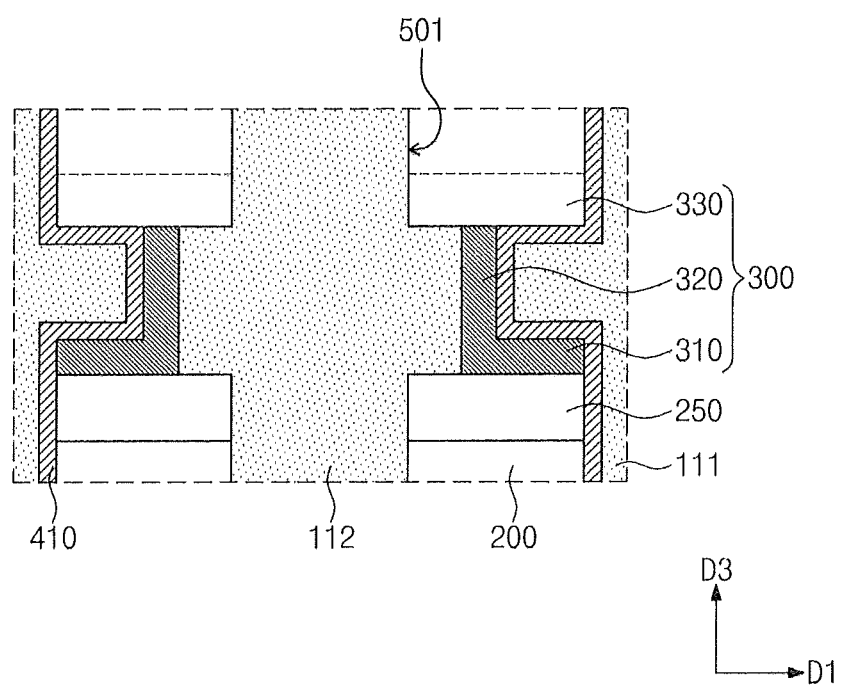
FIG. 6D and FIG. 6G are enlarged views of regions III of FIG. 6C and FIG. 6F, respectively.

Referring to FIG. 6C and FIG. 6D, the second sacrificial pattern 720 and the etch stop layer 715 may be removed by, for example, a wet etching process, and thus, the contact hole 501 may be formed on the lower electrode patterns 300. A process of etching the second sacrificial pattern 720 and the etch stop layer 715 may be performed in substantially the same manner as the etching process described with reference to FIG. 3N, However, in the present embodiment, the process of etching the etch stop layer 715 may be performed to etch a portion of the second insulating pattern 112, and thus, the contact hole 501 may be formed to have a flat bottom surface. The bottom surface of the contact hole 501 may expose the upper horizontal portion 330 of the lower electrode pattern 300, the first protection pattern 410, and the second insulating pattern 112. The contact hole 501 may be formed to have a side surface exposing the protection patterns 410, 430, and 440 and the second insulating pattern 112. The etching process may be performed to prevent the vertical portions 320 of the lower electrode patterns 300 from being etched.

Figure 6E:
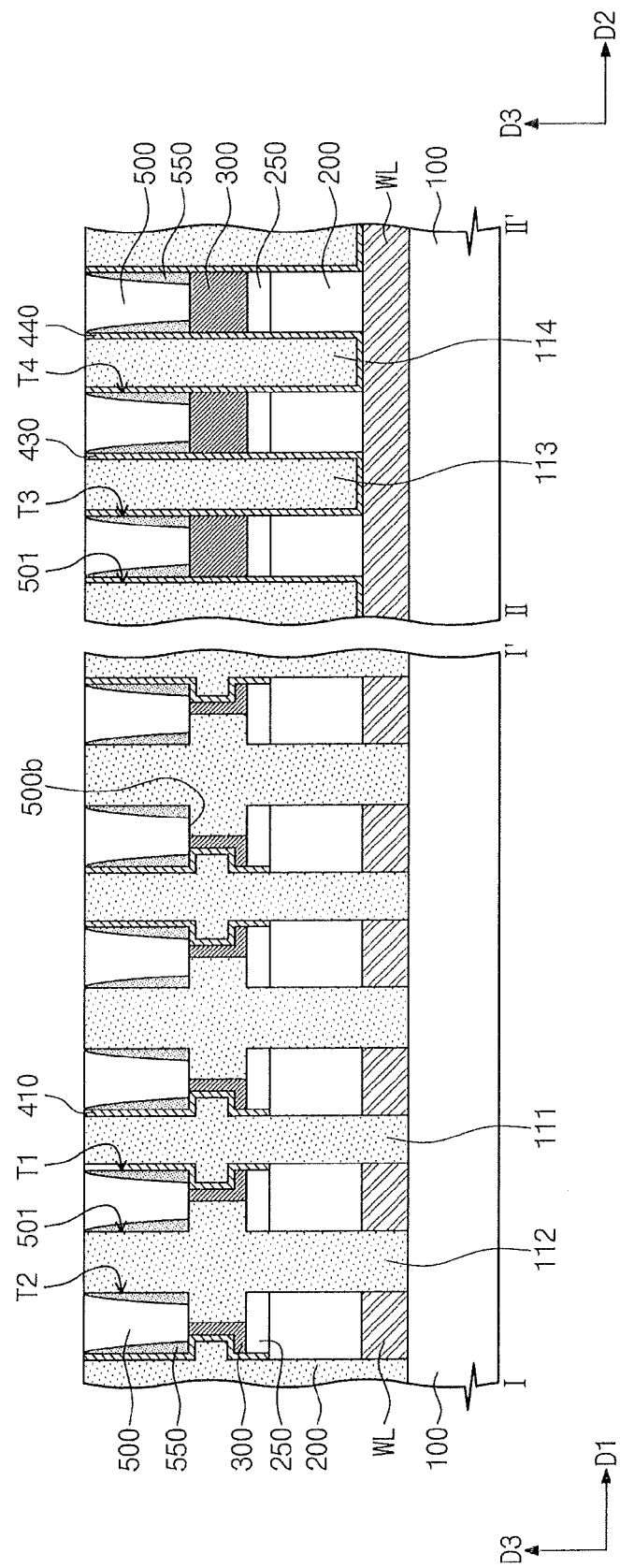

Referring to FIG. 6E, the spacer pattern 550 may be formed on a side surface of the contact hole 501. The phase-changeable pattern 500 may be formed in the contact hole 501. The formation of the spacer pattern 550 and the phase-changeable pattern 500 may be performed using the same or similar method as that described with reference to FIG. 3P. A portion of the bottom surface 500b of the phase-changeable pattern 500 may be formed to be in contact with the top surfaces 300a of the lower electrode patterns 300. Other portion of the bottom surface 500b may be in contact with the first protection pattern 410 and the second insulating pattern 112. In example embodiments, each of the lower electrode patterns 300 may have an "L"-shaped section, allowing for a reduction in contact area between the phase-changeable pattern 500 and the lower electrode patterns 300.

Figure 6F:
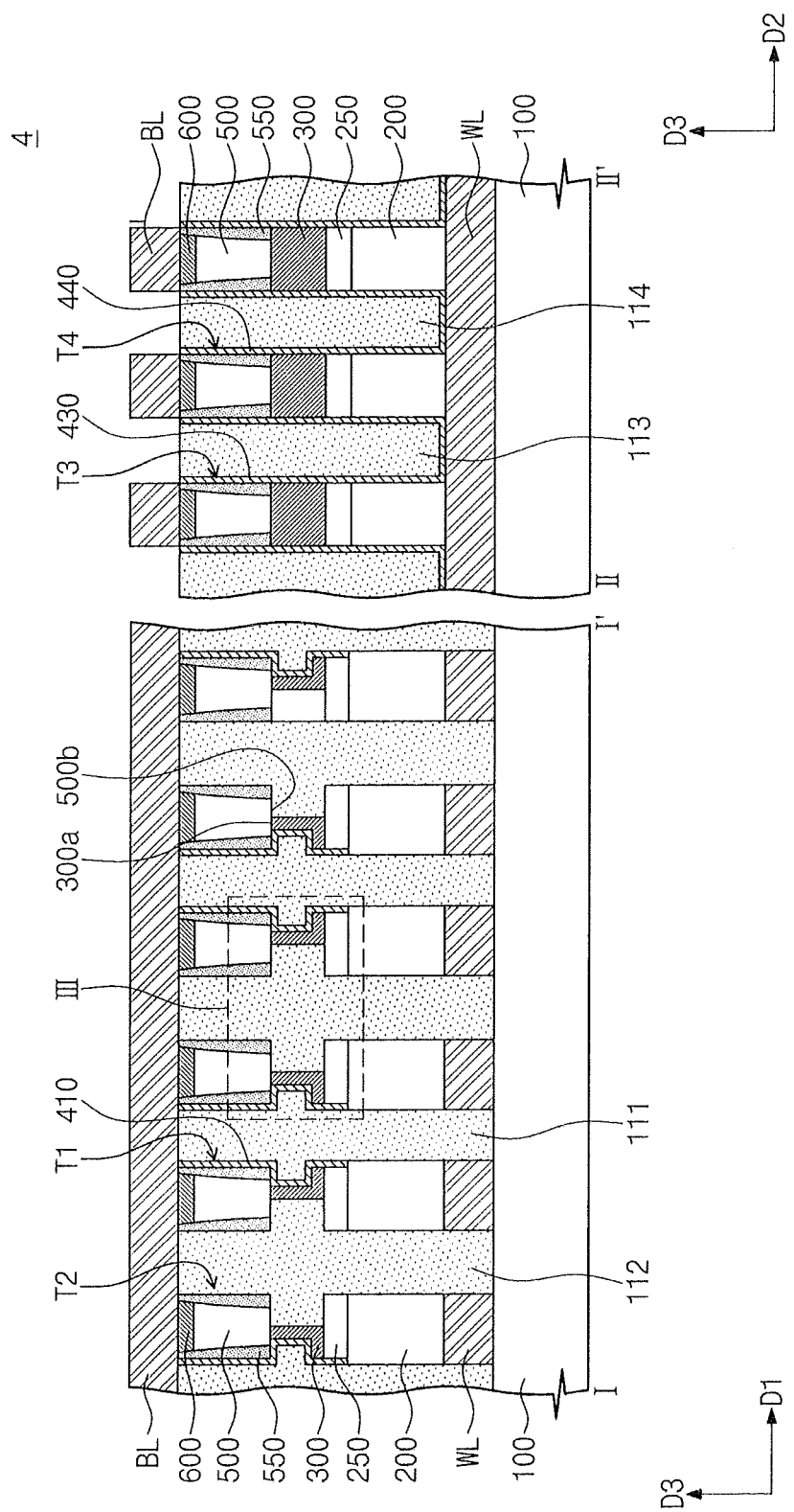
Figure 6G:
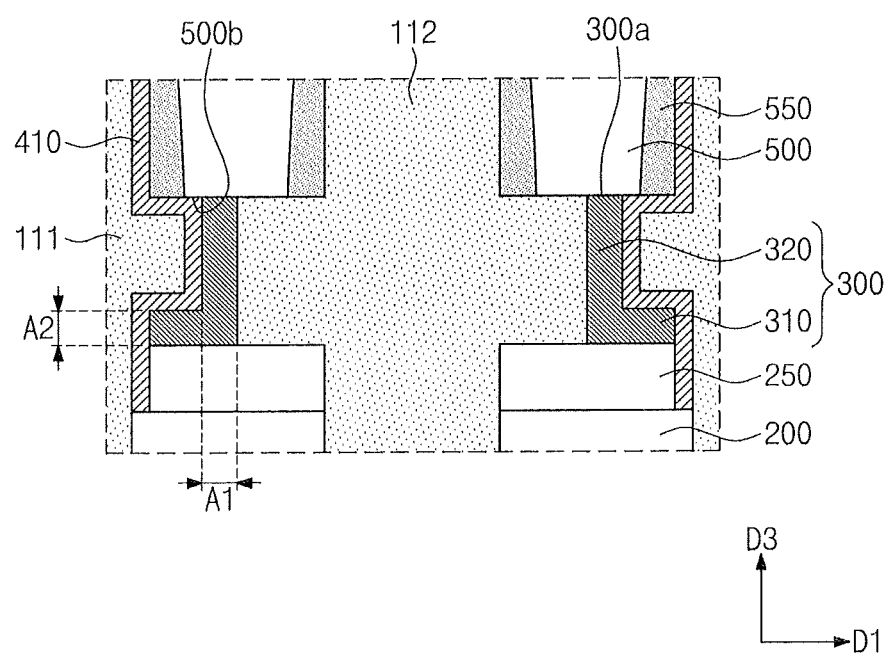

Referring to FIG. 6F and FIG. 6G, the upper electrode pattern 600 and the bit lines BL may be formed on the phase-changeable pattern 500. The upper electrode pattern 600 and the bit lines BL may be formed using the same or similar method as that described with reference to FIG. 3Q.

Accordingly, the semiconductor device 4 may be fabricated to have the structure of FIG. 6F.

Figure 7:
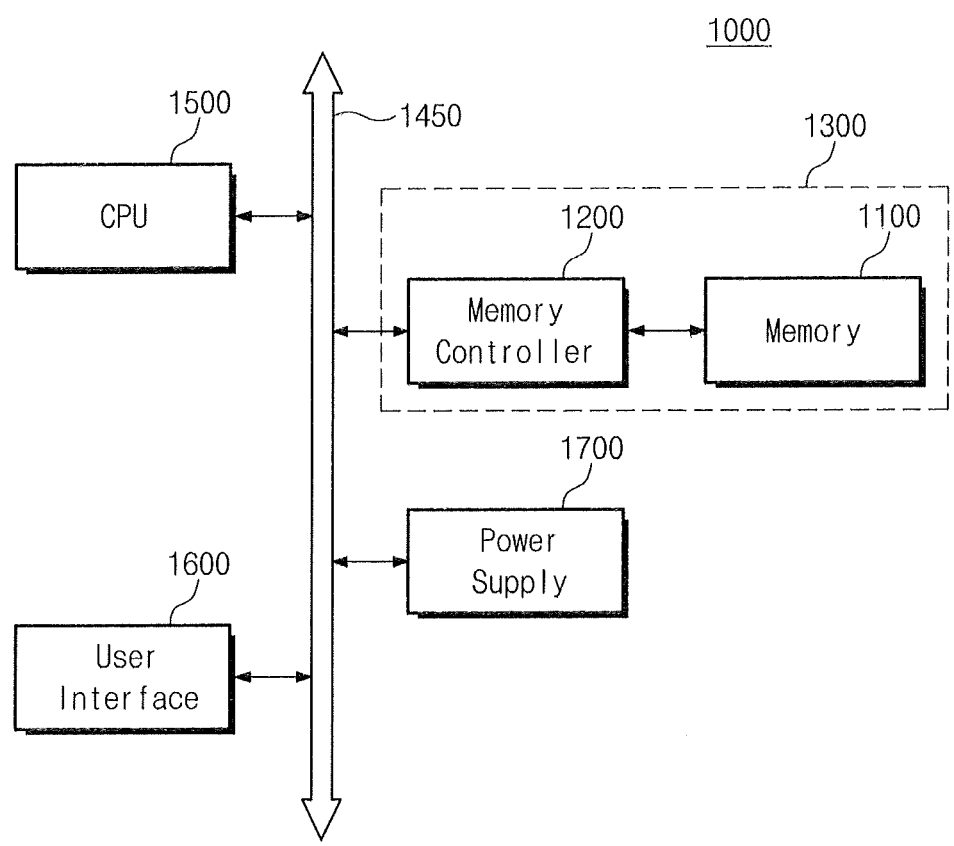
FIG. 7 is a schematic block diagram illustrating an example of electronic devices including a semiconductor device according to example embodiments of the inventive concepts.

FIG. 7 is a block diagram of an electronic device including a semiconductor device according to example embodiments of the inventive concepts.

The electronic device 1000 according to example embodiments of the inventive concepts may be used in one or more of an application chipset, a camera image sensor, a camera image signal processor (ISP), a personal digital assistant (PDA), a laptop computer, a portable computer, a web tablet, a wireless phone, a mobile phone, a digital music player, a wire or wireless electronic device, or a complex electronic device including at least two of the aforementioned components.

Referring to FIG. 7, the electronic device 1000 may include a semiconductor memory device 1300, a central processing unit (CPU) 1500, a user interface 1600, and a power supply device 1700, which are connected to a system bus 1450. The semiconductor memory device 1300 may include a memory device 1100, which may be one of the semiconductor devices described previously, and a memory controller 1200.

Data processed by the CPU 1500 and/or input from the user interface 1600 may be stored in the memory device 1100, and the memory controller 1200 may be configured to control such data exchange among the CPU 1500, the user interface 1600, and the memory device 1100. The memory device 1100 may constitute a solid state drive (SSD), and in this case, an operating speed of the electronic device 1000 may be greatly increased.

According to example embodiments of the inventive concepts, a lower electrode pattern may be provided to have a top surface that is an area smaller than that of a bottom surface of a phase-changeable pattern. Accordingly, it is possible to reduce a contact area between the lower electrode pattern and the phase-changeable pattern and an amount of current required for a program operation of a semiconductor device.

The lower electrode pattern may be conformally formed by a deposition process. This makes it possible to improve uniformity in size of the lower electrode patterns. For example, top surfaces of the lower electrode patterns can have substantially the same area. Thus, it is possible to improve uniformity in contact area between the lower electrode patterns and the phase-changeable patterns. This makes it possible to improve uniformity in the amount of current required for the program operation of the semiconductor device. Memory cells may be formed in a self-aligned manner, and this allows memory cells to be programmed using a uniform program current, when the program operation is performed. As a result, it is possible to improve reliability of the semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device comprising:

forming a selection device layer, a first sacrificial pattern, and a second sacrificial pattern on a substrate;

forming a first trench to penetrate the first and second sacrificial patterns;

laterally etching a side surface of the first sacrificial pattern to form a recess region exposing a bottom surface of the second sacrificial pattern, the recess region being connected to the first trench;

conformally forming a lower electrode pattern in the recess region to cover a top surface of the selection device layer, the side surface of the first sacrificial pattern, and the bottom surface of the second sacrificial pattern;

forming a first protection pattern in the first trench and the recess region to cover the lower electrode pattern and the second sacrificial pattern;

forming an insulating pattern in the first trench to cover the first protection pattern; and forming second mask layers spaced apart from each other on the second sacrificial pattern and a first mask layer interposed between the second mask layers, wherein the forming of the first trench comprises etching the second sacrificial pattern exposed by the first and second mask layers.

2. The method of claim 1 further comprising:

forming a second trench to penetrate the first sacrificial pattern and the second sacrificial pattern;

removing the first sacrificial pattern exposed by the second trench to expose the lower electrode pattern;

forming a second protection pattern in the second trench to cover the lower electrode pattern; and forming a second insulating pattern in the second trench to cover the second protection pattern.

3. The method of claim 2 wherein the forming of the second trench comprises:

removing the first mask layer to expose the second sacrificial pattern; and removing the second sacrificial pattern exposed by the second mask layer.

4. The method of claim 2 further comprising:

removing the second sacrificial pattern to form a contact hole exposing the first protection pattern; and forming a phase-changeable pattern in the contact hole.

5. The method of claim 4 wherein the forming of the contact hole comprises removing the lower electrode pattern from a top surface of the first protection pattern to expose the first protection pattern.

6. The method of claim 4 wherein a portion of the phase-changeable pattern is in contact with the lower electrode pattern, and other portion of the phase-changeable pattern is contact with the first and second protection patterns.

7. The method of claim 4 further comprising forming a spacer pattern on a side surface of the contact hole.

8. The method of claim 1 wherein the forming of the lower electrode pattern comprises:

depositing a lower electrode layer in the first trench and the recess region to have a thickness ranging from 1 nm to 10 nm; and etching the lower electrode layer to remove the lower electrode layer from a side surface of the second sacrificial pattern.

* * * * *